United States Patent
Im et al.

(10) Patent No.: US 11,244,936 B2
(45) Date of Patent: Feb. 8, 2022

(54) SEMICONDUCTOR DEVICE PACKAGE AND APPARATUS COMPRISING THE SAME

(71) Applicant: SAMSUNG ELECTRONICS CO., LTD., Suwon-si (KR)

(72) Inventors: Yun Hyeok Im, Hwaseong-si (KR); Hee Seok Lee, Suwon-si (KR); Taek Kyun Shin, Gwangmyeong-si (KR); Cha Jea Jo, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/439,409

(22) Filed: Jun. 12, 2019

(65) Prior Publication Data

US 2019/0295998 A1 Sep. 26, 2019

Related U.S. Application Data

(63) Continuation of application No. 15/849,767, filed on Dec. 21, 2017, now abandoned.

(30) Foreign Application Priority Data

Apr. 26, 2017 (KR) .................... 10-2017-0053633

(51) Int. Cl.
*H01L 25/10* (2006.01)
*H01L 23/538* (2006.01)
(Continued)

(52) U.S. Cl.
CPC ........ *H01L 25/105* (2013.01); *H01L 21/4853* (2013.01); *H01L 21/563* (2013.01);
(Continued)

(58) Field of Classification Search
None
See application file for complete search history.

(56) References Cited

U.S. PATENT DOCUMENTS 6,300,224 B1 10/2001 Arima et al.
6,680,524 B2 1/2004 Minamio et al.
(Continued)

FOREIGN PATENT DOCUMENTS

| KR | 10-2002-0065273 A | 8/2002 |
| KR | 10-2010-0098892 A | 9/2010 |
| KR | 10-2013-0076899 A | 7/2013 |

OTHER PUBLICATIONS

Korean Office action dated Sep. 18, 2020 for corresponding Korean Application No. 10-2017-0053633.
(Continued)

*Primary Examiner* — Long Pham
(74) *Attorney, Agent, or Firm* — Lee IP Law, P.C.

(57) ABSTRACT

A semiconductor device package and a semiconductor apparatus are provided. The semiconductor device includes a first semiconductor package, a second semiconductor package, and an interposer between the first and second semiconductor packages. The first semiconductor package includes a first semiconductor package substrate and a first semiconductor chip. The second semiconductor package includes a second semiconductor package substrate and a second semiconductor chip. The interposer electrically connects the first semiconductor package to the second semiconductor package and includes a first interposer hole passing through the interposer. The first semiconductor chip includes a second portion which protrudes from a first portion, and the second portion is inserted into the first interposer hole.

13 Claims, 46 Drawing Sheets

(51) Int. Cl.

| | |
|---|---|
| *H01L 23/498* | (2006.01) |
| *H01L 23/13* | (2006.01) |
| *H01L 21/56* | (2006.01) |
| *H01L 21/48* | (2006.01) |
| *H01L 21/683* | (2006.01) |
| *H01L 23/31* | (2006.01) |
| *H01L 29/06* | (2006.01) |
| *H01L 23/367* | (2006.01) |

(52) U.S. Cl.
CPC .......... *H01L 21/6836* (2013.01); *H01L 23/13* (2013.01); *H01L 23/3128* (2013.01); *H01L 23/367* (2013.01); *H01L 23/49816* (2013.01); *H01L 23/5385* (2013.01); *H01L 29/0657* (2013.01); *H01L 2221/68327* (2013.01); *H01L 2224/16225* (2013.01); *H01L 2224/48091* (2013.01); *H01L 2224/48227* (2013.01); *H01L 2224/73265* (2013.01); *H01L 2225/107* (2013.01); *H01L 2225/1023* (2013.01); *H01L 2225/1041* (2013.01); *H01L 2225/1058* (2013.01); *H01L 2924/10158* (2013.01); *H01L 2924/15311* (2013.01); *H01L 2924/181* (2013.01)

(56) References Cited

U.S. PATENT DOCUMENTS

| | | | |
|---|---|---|---|
| 7,282,431 | B2 | 10/2007 | Kang et al. |
| 7,691,726 | B2 | 4/2010 | Seng |
| 7,799,610 | B2 | 9/2010 | Tan et al. |
| 8,058,706 | B2* | 11/2011 | Feng ...................... H01L 24/32 |
| | | | 257/618 |
| 9,305,855 | B2* | 4/2016 | Kim ......................... H01L 25/10 |
| 2012/0241925 | A1 | 9/2012 | Yoon et al. |
| 2015/0084170 | A1 | 3/2015 | Im et al. |
| 2015/0206812 | A1 | 7/2015 | Kim et al. |
| 2016/0056103 | A1* | 2/2016 | Kim .................. H01L 23/49833 |
| | | | 257/774 |
| 2016/0172337 | A1* | 6/2016 | Kim ......................... H01L 25/10 |
| | | | 257/692 |
| 2017/0154878 | A1* | 6/2017 | Kim ......................... H01L 25/50 |
| 2017/0207205 | A1* | 7/2017 | Kim ........................ H01L 21/565 |
| 2018/0013052 | A1* | 1/2018 | Oliver ................. H01L 25/0652 |
| 2018/0315740 | A1* | 11/2018 | Im ....................... H01L 23/3128 |

OTHER PUBLICATIONS

Taiwanese Office action dated Jun. 9, 2021 for corresponding TW 107112448.

* cited by examiner

SEMICONDUCTOR DEVICE PACKAGE AND APPARATUS COMPRISING THE SAME

CROSS-REFERENCE TO RELATED APPLICATIONS

This is a continuation application based on pending application Ser. No. 15/849,767, filed Dec. 21, 2017, the entire contents of which is hereby incorporated by reference.

Korean Patent Application No. 10-2017-0053633, filed on Apr. 26, 2017, and entitled, "Semiconductor Device Package and Method for Fabricating the Same," is incorporated by reference herein in its entirety.

BACKGROUND

1. Field

One or more embodiments described herein relate to a semiconductor device package and a method for fabricating a semiconductor device package.

2. Description of the Related Art

Reducing the size of electronic devices continues to be a goal of system designers. One way to reduce the size of electronic devices to reduce the thickness of the semiconductor device packages in those devices. Reducing the thickness of semiconductor device packages raises issues of effective dissipation of heat generated from semiconductor chips in those packages.

SUMMARY

In accordance with one or more embodiments, a semiconductor device package includes a first semiconductor package including a first semiconductor package substrate and a first semiconductor chip; a second semiconductor package including a second semiconductor package substrate and a second semiconductor chip; and an interposer between the first semiconductor package and the second semiconductor package to electrically connect the first semiconductor package to the second semiconductor package, wherein the interposer includes a first interposer hole passing through the interposer and wherein the first semiconductor chip includes a first portion and a second portion which protrudes from the first portion and which is inserted into the first interposer hole.

In accordance with one or more other embodiments, a semiconductor device package includes a first semiconductor package including a first semiconductor package substrate and a first semiconductor chip including a first portion and a second portion protruding from the first portion; a second semiconductor package including a second semiconductor package substrate and a second semiconductor chip; an interposer between the first semiconductor package and the second semiconductor package, the interposer including a first interposer hole exposing the second portion, the interposer including a first surface facing a second surface; and a connector on the first surface of the interposer, wherein a width of the first portion is larger than a width of the second portion and wherein a part of the first portion overlaps the connector.

In accordance with one or more other embodiments, an apparatus includes a first semiconductor package; a second semiconductor package; and an interposer to electrically connect the first semiconductor package to the second semiconductor package, wherein the interposer includes a hole and wherein a first portion of a semiconductor chip in the first semiconductor package is in the hole and extends in a direction of the second semiconductor package.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
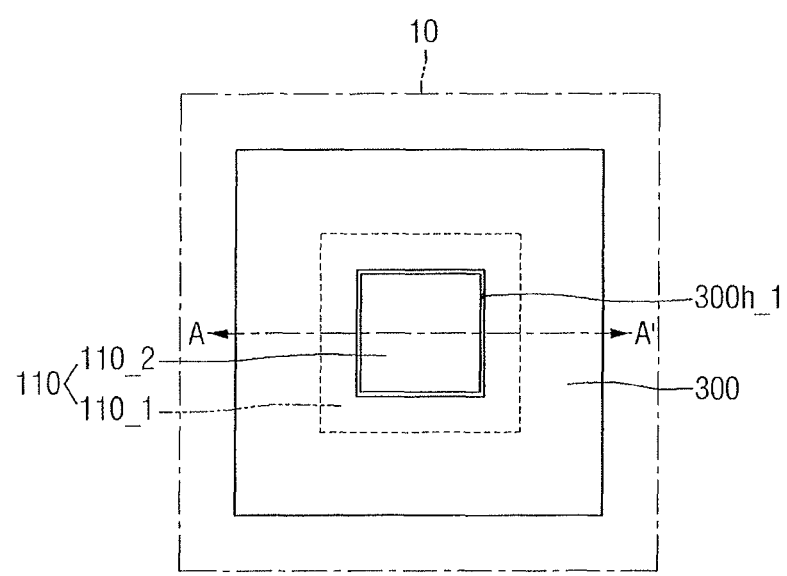
FIGS. 1 to 24 illustrate embodiments of a semiconductor device package.
Figure 2A:
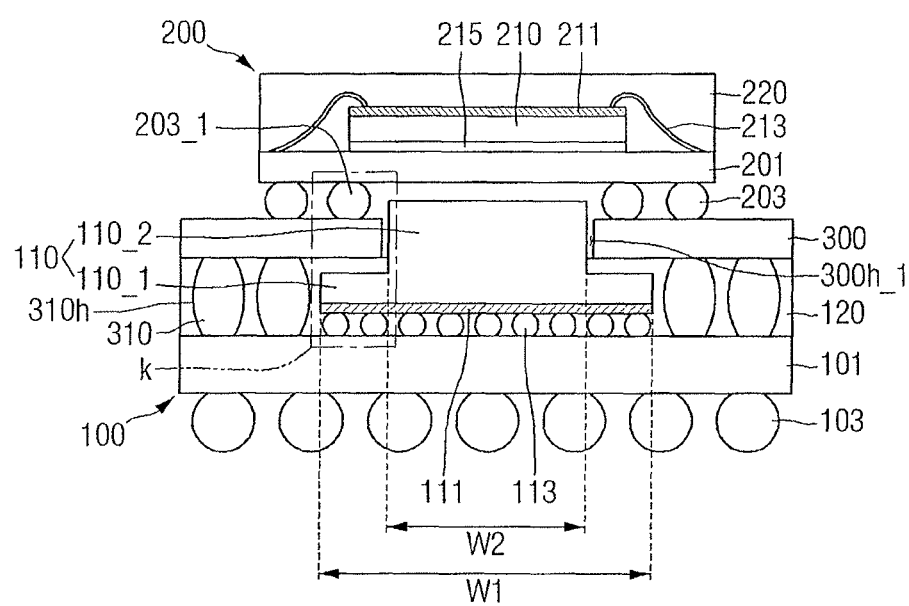
Figure 2B:
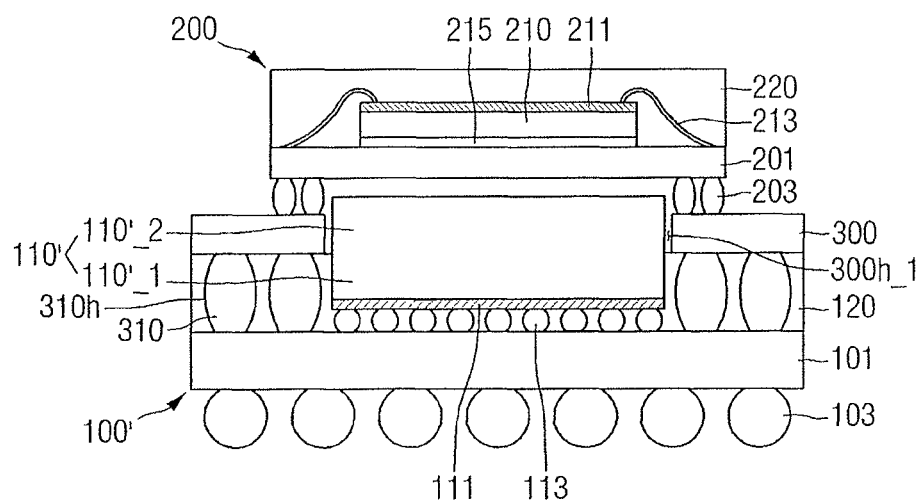
Figure 2C:
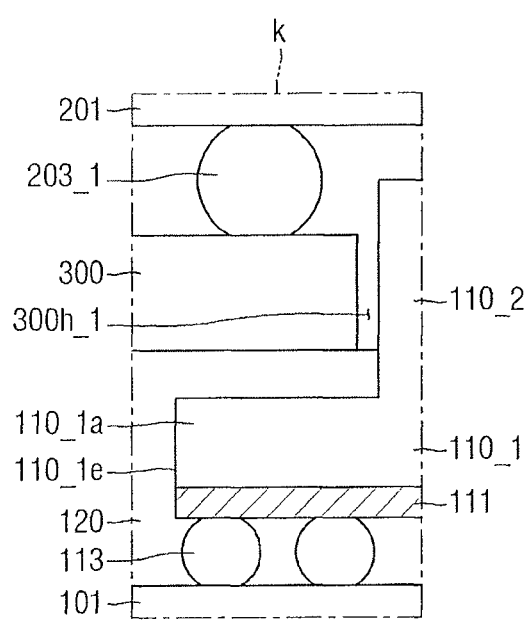
Figure 3:
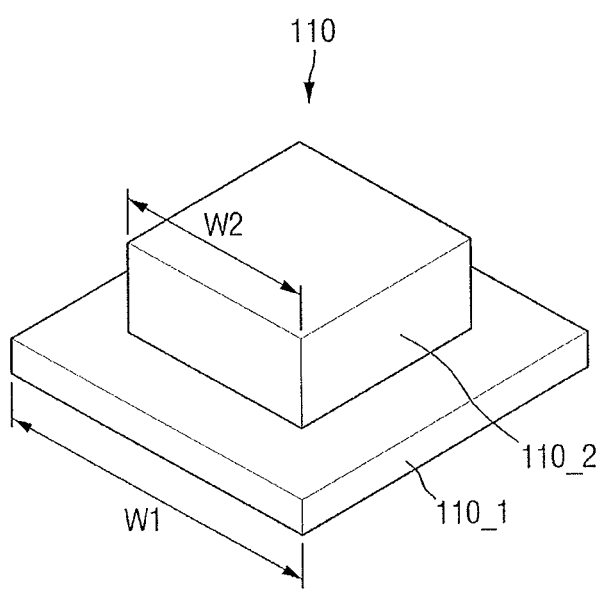
Figure 4A:
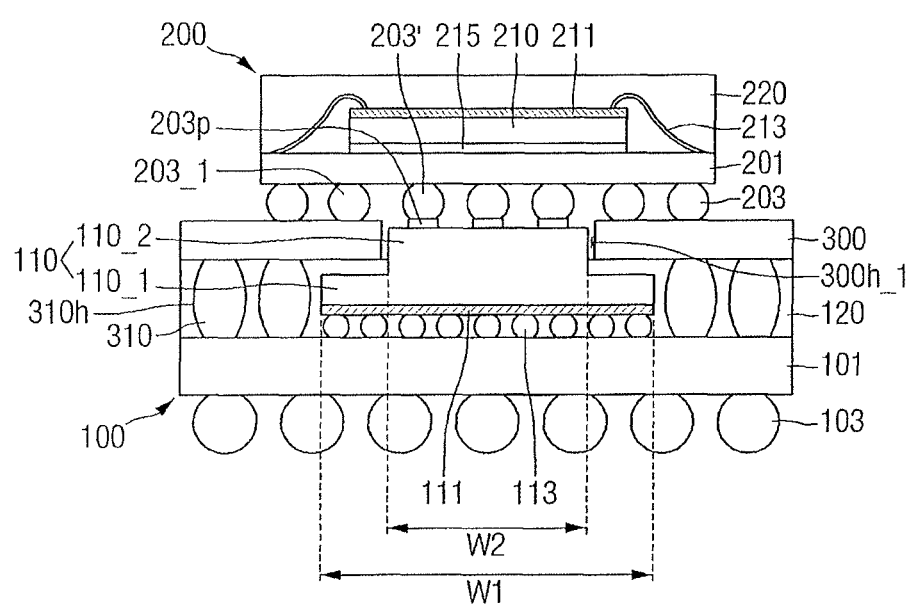
Figure 4B:
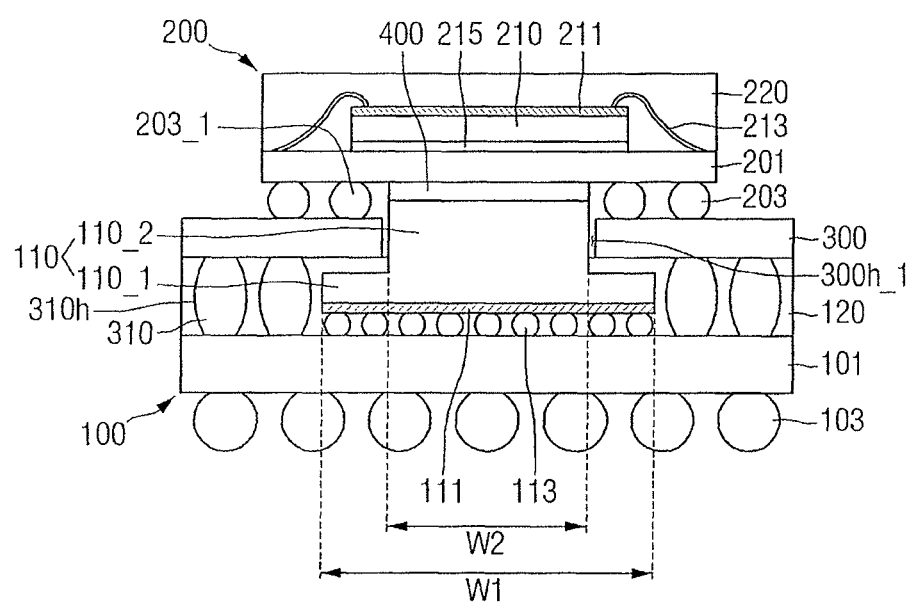
Figure 4C:
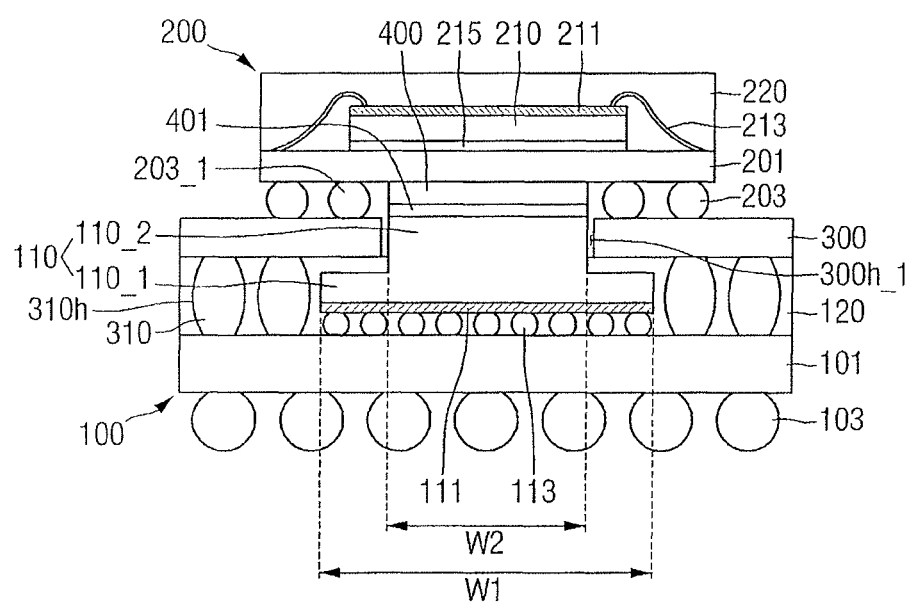

FIG. 1 illustrates an embodiment of a semiconductor device package. FIGS. 2A and 2B illustrate cross-sectional views taken along line A-A' in FIG. 1 according to one or more embodiments. FIG. 2C illustrates an enlarged view of an embodiment of region k in FIG. 2A. FIG. 3 illustrates an embodiment of a semiconductor chip in a semiconductor device package. FIGS. 4A to 4C illustrate cross-sectional views taken along line A-A' in FIG. 1 according to some embodiments.

FIG. 1 illustrates an embodiment of a partial area of a substrate 10 on which a plurality of semiconductor packages is to be mounted. In FIG. 1, only the substrate 10 and an interposer 300 are shown for clarity of illustration. In FIGS. 2A, 2B, and 4A to 4C, the substrate 10 is not shown for clarity of illustration.

Referring to FIGS. 1 and 2A, a semiconductor device package according to some embodiments may include a first semiconductor package 100 and a second semiconductor package 200, and the interposer 300 is on the substrate 10. The first semiconductor package 100 may be on the substrate 10. The first semiconductor package 100 may include a first semiconductor package substrate 101, a first semiconductor chip 110, and a first molding material 120.

The first semiconductor package substrate 101 may be a substrate for a package, for example, a printed circuit board (PCB) or a ceramic substrate. The first semiconductor package substrate 101 may include first and second surfaces facing each other. The first semiconductor chip 110 may be mounted on the first surface of the first semiconductor package substrate 101. A first connection element (e.g., connector) 103 may be attached to the second surface of the first semiconductor package substrate 101. A predetermined number of the first connection elements (or connectors) 103 are illustrated. A different number of the first connection elements 103 may be attached to the second surface of the first semiconductor package substrate 101 in another embodiment.

The first connection element 103 may be, for example, a conductive ball or a solder ball. For example, the first connection element 103 may be one of a conductive bump, a conductive spacer, and a pin grid array (PGA). The first semiconductor package 100 may be electrically connected to an external device through the first connection element 103.

The first semiconductor chip 110 may be, for example, a flip chip. The lower surface of the first semiconductor chip 110 may be a first semiconductor device circuit region 111. A second connection element 113 may be in the first semiconductor device circuit region 111. The second connection element 113 may be, for example, a solder ball or a conductive bump.

The first semiconductor chip 110 may be electrically connected to the first semiconductor package substrate 101 through the second connection element 113. A predetermined number of the second connection elements 113 are illustrated. A different number of the second connection elements 113 may be included in other embodiments.

Referring to FIGS. 1, 2A, and 3, the shape of the first semiconductor chip 110 may be, for example, a stepped shape. In some embodiments, the width W1 of a first portion 110_1 may be larger than a width W2 of a second portion 110_2. The first semiconductor chip 110 may include the first portion 110_1 and the second portion 110_2. The second portion 110_2 may protrude from the first portion 110_1. In some embodiments, the first portion 110_1 may include, for example, the first semiconductor device circuit region 111. In some embodiments, The first portion 110_1 and the second portion 110_2 may be connected to each other.

Each of the first portion 110_1 and the second portion 110_2 may be a portion of one first semiconductor chip 110. In one embodiment, the first portion 110_1 and the second portion 110_2 may be different semiconductor chips. In one embodiment, the first semiconductor chip 110 may include two different semiconductor chips.

The shape of the first semiconductor chip 110 may be different from that illustrated in FIG. 2A. For example, referring to FIG. 2B, the shape of a first semiconductor chip 110 may not have any steps. A first portion 110_1 of the first semiconductor chip 110 may be a portion not inserted into a first interposer hole 300h_1. A second portion 110_2 of the first semiconductor chip 110 may be inserted into the first interposer hole 300h_1. The first semiconductor chip 110 may be one semiconductor chip, or in another embodiment a stack of a plurality of semiconductor chips may be included.

Referring again to FIGS. 1 and 2A, the first molding material 120 may include a hole 310h for receiving a third connection element 310. The first molding material 120 may completely fill a space between the first semiconductor chip 110 and the first semiconductor package substrate 101. The first molding material 120 may completely surround the side surface of the first portion 110_1 and the side surface of the third connection element 310. The first molding material 120 may completely fill, for example, a space between the upper surface of the first portion 110_1 of the first semiconductor chip and the interposer 300.

The first molding material 120 may surround only a part of the side surface of the second portion 110_2, for example. In one embodiment, the first molding material 120 may completely fill the space between the upper surface of the first portion 110_1 and the interposer 300, but may not contact the side surface of the second portion 110_2. Accordingly, an empty space may be between the side surface of the second portion 110_2 and the first molding material 120. The first molding material 120 may be, for example, an epoxy molding compound (EMC).

The second semiconductor package 200 may be on the substrate 10 and may include a second semiconductor package substrate 201, a second semiconductor chip 210, and a second molding material 220.

The second semiconductor package substrate 201 may be the same as or different from the first semiconductor package substrate 101. The second semiconductor package substrate 201 may include first and second surfaces facing each other.

The second semiconductor chip 210 may be mounted on the first surface of the second semiconductor package substrate 201. A fourth connection element 203 may be attached to the second surface of the second semiconductor package substrate 201. The fourth connection element 203 may be the same as or different from the first connection element 103. The second semiconductor package 200 may be electrically connected to an external device or another semiconductor package through the fourth connection element 203.

The second semiconductor chip 210 may be attached to the second semiconductor package substrate 201 through a first adhesive 215. The second semiconductor chip 210 may be electrically connected to the second semiconductor package substrate 201 through a fifth connection element 213, for example. The upper surface of the second semiconductor chip 210 may be a second semiconductor device circuit region 211. The fifth connection element 213 may be, for example, wire bonding. The second semiconductor chip 210 is one semiconductor chip, or in another embodiment a stack of a plurality of semiconductor chips may be included.

Each of the first semiconductor chip 110 and the second semiconductor chip 210 may be, for example, a memory chip, a logic chip, or another type of church. When the first semiconductor chip 110 and/or the second semiconductor chip 210 is a logic chip, the first semiconductor chip 110 and/or the second semiconductor chip 210 may be variously designed in consideration of operations to be performed. When the first semiconductor chip 110 and/or the second semiconductor 202 is a memory chip, the memory chip may be, for example, a non-volatile memory chip.

The second molding material 220 may be on the second semiconductor package substrate 201. The second molding material 220 may seal the upper surface of the second semiconductor package substrate 201, the second semiconductor chip 210, and the fifth connection element 213. The second molding material 220 may include, for example, the same material as the first molding material 120.

The interposer 300 may be between the first semiconductor package 100 and the second semiconductor package 200. The interposer 300 may electrically connect the first semiconductor package 100 to the second semiconductor package 200. The interposer 300 may include first and second surfaces facing each other. A connection element of the semiconductor package on the interposer 300 may be on the first surface of the interposer 300. The third connection element 310 may be attached to the second surface of the interposer 300. The interposer 300 may include the first interposer hole 300h_1 passing through the interposer 300. The first interposer hole 300h_1 may extend from the first surface to the second surface of the interposer 300.

In some embodiments, the second semiconductor package 200 may be on the first semiconductor package 100. For example, the first semiconductor package 100 and the second semiconductor package 200 may have a Package on Package (PoP) structure. The first portion 110_1 of the first semiconductor chip 110 may be between the second portion 110_2 and the first semiconductor package substrate 101. The interposer 300 may be between the first semiconductor package 100 and the second semiconductor package 200. The third connection element 310 may be inserted into a hole 310h of the first molding material 120. The fourth connection element 203 may be on the first surface of the interposer 300. For example, the fourth connection element 203 may be between the first surface of the interposer 300 and the second semiconductor package substrate 201. The fourth connection element 203 may be on a portion of the first surface of the interposer 300, other than a portion where the first interposer hole 300h_1 is formed.

The first semiconductor package substrate 101 may be electrically connected to the interposer 300 through the third connection element 310. The interposer 300 may be electrically connected to the second semiconductor package substrate 201 through the fourth connection element 203.

The second portion 110_2 of the first semiconductor chip may be inserted into the first interposer hole 300h_1. For example, the first interposer hole 300h_1 may expose the second portion 110_2 of the first semiconductor chip when viewed in a direction from the first surface of the interposer 300 toward the second surface of the interposer 300 as in FIG. 1.

The second portion 110_2 of the first semiconductor chip may protrude from the upper surface of the first surface of the interposer 300. In one embodiment, depending on a semiconductor chip fabricating process, the second portion 110_2 may not protrude from the upper surface of the first surface of the interposer 300.

Referring to FIGS. 1, 2A, and 2C, a portion 110_1a of the first portion of the first semiconductor chip may at least partially overlap a fourth_first connection element 203_1. The overlapping direction may be, for example, a vertical direction with respect to the first semiconductor package substrate 101. For example, the fourth connection element 203 may include a plurality of connection elements for electrically connecting the interposer 300 with the second semiconductor package 200. For example, a plurality of connection elements of the fourth connection element 203 may include the fourth_first connection element 203_1. The fourth_first connection element 203_1 may be a connection element closest to the first interposer hole 300h_1 among the plurality of connection elements in the fourth connection element 203. The portion 110_1a of the first portion of the first semiconductor chip may be a portion including an end portion 110_1e of the first portion of the first semiconductor chip. For example, the portion 110_1a of the first portion of the first semiconductor chip may not overlap the second portion 110_2 of the first semiconductor chip.

Referring again to FIGS. 1 and 2A, an empty space may be between a sidewall of the first interposer hole 300h_1 and a sidewall of the second portion 110_2 of the first semiconductor chip. For example, the area of the first interposer hole 300h_1 may be larger than the area of the upper surface of the second portion 110_2 of the first semiconductor chip. Also, for example, an empty space may be between the upper surface of the second portion 110_2 of the first semiconductor chip and the second surface of the second semiconductor package substrate 201.

As shown in FIG. 4A, a fourth connection element 203' and a pad 203p may be between the upper surface of the first semiconductor chip 110 and the second surface of the second semiconductor package substrate 201. The fourth connection element 203' may include a material (e.g., a heat transfer material) for transferring the heat of the first semiconductor package 100 to the outside. The pad 203p may be, for example, a wetting layer including an easily wettable material. The pad 203p may be, for example, a metal wetting layer. The first semiconductor chip 110 may be thermally connected to the second semiconductor package 200 through the fourth connection element 203' and the pad 203p on the upper surface of the first semiconductor chip 110.

A heat transfer material may be, for example, between the sidewall of the first interposer hole 300h_1 and the sidewall of the second portion 110_2 of the first semiconductor chip. Further, for example, as shown in FIG. 4B, a heat transfer material layer 400 may be further formed between the upper surface of the second portion 110_2 of the first semiconductor chip and the second surface of the second semiconductor package substrate 201. The heat transfer material layer 400 may be, for example, a thermal interface material (TIM). In FIG. 4B, the heat transfer material layer 400 is formed only between the upper surface of the second portion 110_2 of the first semiconductor chip and the second surface of the second semiconductor package substrate 201.

In one embodiment, the heat transfer material layer 400 may be partially formed along the sidewall of the second portion 110_2 of the first semiconductor chip, as well as between the upper surface of the second portion 110_2 of the first semiconductor chip and the second surface of the second semiconductor package substrate 201. The heat transfer material layer 400 may fill at least a part of the empty space between the sidewall of the second portion 110_2 of the first semiconductor chip and the sidewall of the first interposer hole 300h_1. The first semiconductor chip 110 may be thermally connected to the second semiconductor package 200 through the heat transfer material layer 400.

As shown in FIG. 4C, an insertion adhesive layer 401 may be between the heat transfer material layer 400 and the second surface of the second semiconductor package substrate 201.

In the semiconductor device package according to some embodiments, a portion of the first semiconductor chip 110 may be inserted into the first interposer hole 300h_1 to increase the overall thickness of the first semiconductor chip 110. When the overall thickness of the first semiconductor chip 110 is increased, the heat generated from the first semiconductor chip 110 may be effectively transferred in a horizontal direction. When the heat is effectively transferred in the horizontal direction, the thermal resistance is reduced and performance of the semiconductor device package may be improved. Further, when the heat is effectively transferred in the horizontal direction, the temperature distribution inside the semiconductor chip becomes uniform. As a result, reliability of the semiconductor device package may be improved.

According to some embodiments, in the semiconductor device package, the second portion 110_2 of the first semiconductor chip may be inserted into the first interposer hole 300h_1. Accordingly, the heat generated from the first semiconductor chip 110 may be effectively transferred in the vertical direction. When the heat is effectively transferred in the vertical direction, the thermal resistance is reduced and performance of the semiconductor device package may be improved.

Figure 5:
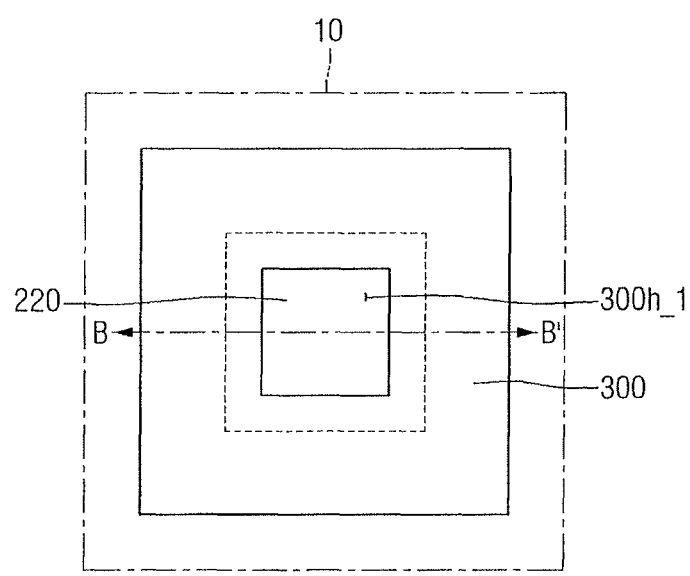
Figure 6A:
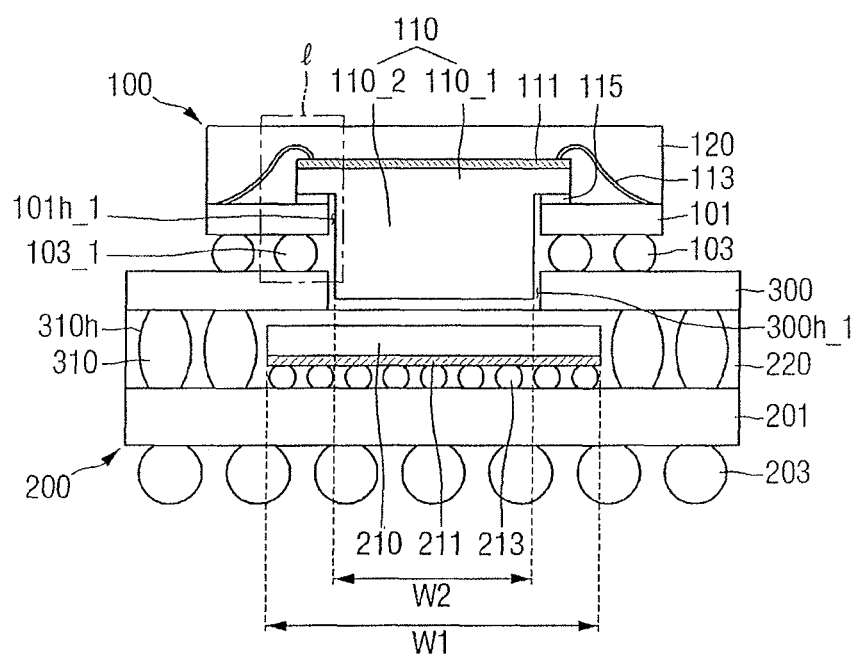
Figure 6B:
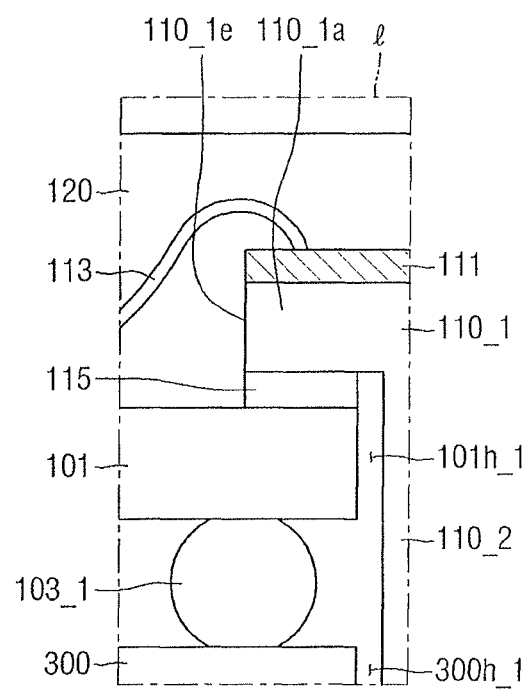
Figure 7:
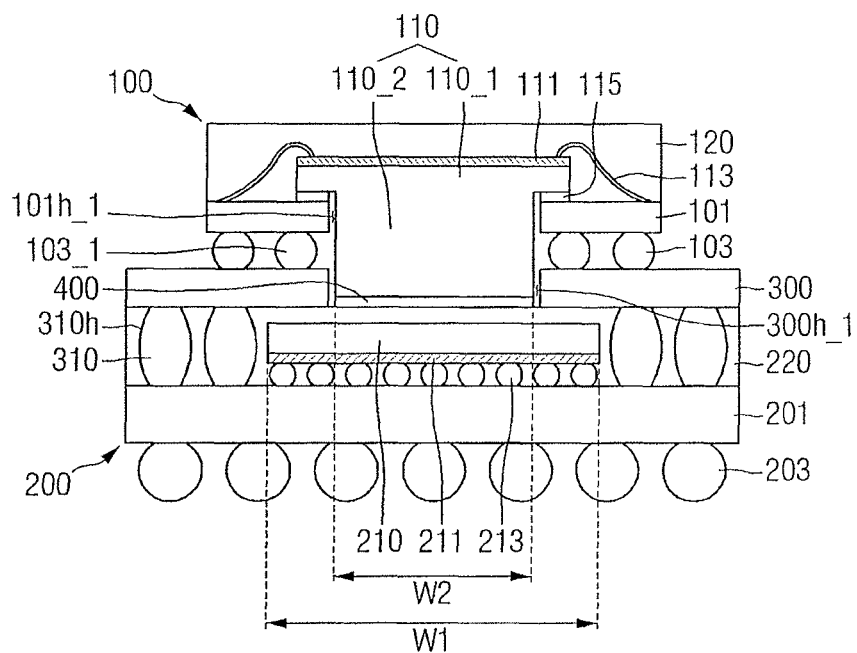

FIG. 5 illustrates another embodiment of a semiconductor device package. FIG. 6A illustrates a cross-sectional view taken along line B-B' in FIG. 5 according to one embodiment. FIG. 6B illustrates an embodiment of an enlarged view of region 1 in FIG. 6A. FIG. 7 illustrates a cross-sectional view taken along line B-B' of FIG. 5 according to one embodiment. FIG. 5 illustrates only a partial area of a substrate 10 on which a plurality of semiconductor packages may be mounted. In FIG. 5, only the substrate 10 and the interposer 300 are shown for clarity of illustration.

Referring to FIGS. 5 and 6A, the first semiconductor package 100 may be on the second semiconductor package 200. The first semiconductor package 100 includes the first semiconductor package substrate 101, the first semiconductor chip 110, the second connection element 113, a second adhesive 115, and the first molding material 120. The first semiconductor package substrate 101 may include a first substrate hole 101h_1 passing through the first semiconductor package substrate 101. The first substrate hole 101h_1 may extend from the first surface to the second surface of the first semiconductor package substrate 101.

The upper surface of the first semiconductor chip 110 may be the first semiconductor device circuit region 111. The second connection element 113 may be, for example, wire bonding. The first semiconductor chip 110 may be electrically connected to the first semiconductor package substrate 101 through the second connection element 113.

The first semiconductor chip 110 may be attached to the first semiconductor package substrate 101 through the second adhesive 115. The second adhesive 115 may be disposed between the first portion 110_1 of the first semiconductor chip and the first semiconductor package substrate 101.

The first molding material 120 may seal the first surface of the first semiconductor package substrate 101, the first semiconductor chip 110, the second connection element 113, and the second adhesive 115.

The second semiconductor package 200 may include the second semiconductor package substrate 201, the second semiconductor chip 210, the fifth connection element 213, and the second molding material 220. The second semiconductor chip 210 may be a flip chip. The lower surface of the second semiconductor chip 210 may be the second semiconductor device circuit region 211. The fifth connection element 213 may be in the second semiconductor device circuit region 211. The fifth connection element 213 may be, for example, a solder ball or a conductive bump.

The second molding material 220 may include the hole 310h for receiving the third connection element 310. The second molding material 220 may completely fill a space between the second semiconductor chip 210 and the second semiconductor package substrate 201. The second molding material 220 may completely surround the side surface of the second semiconductor chip 210 and the side surface of the third connection element 310. The second molding material 220 may be on the upper surface of the second semiconductor chip 210 to cover the upper surface of the second semiconductor chip 210. In one embodiment, the second molding material 220 may cover only a part of the upper surface of the second semiconductor chip 210.

The first connection element 103 may be on the first surface of the interposer 300. The first connection element 103 may be between the first surface of the interposer 300 and the first semiconductor package substrate 101. The first connection element 103 may be on a portion of the first surface of the interposer 300 other than a portion where the first interposer hole 300h_1 is formed.

The first semiconductor package substrate 101 may be electrically connected to the interposer 300 through the first connection element 103. The interposer 300 may be electrically connected to the second semiconductor package substrate 201 through the third connection element 310.

The first portion 110_1 of the first semiconductor chip may include the first semiconductor device circuit region 111. Referring to FIGS. 5, 6A, and 6B, the portion 110_1a of the first portion of the first semiconductor chip may at least partially overlap the first connection element 103_1. The overlapping direction may be, for example, a vertical direction with respect to the second semiconductor package substrate 201.

The first connection element 103 may include, for example, a plurality of connection elements for electrically connecting the interposer 300 to the first semiconductor package 100. In one embodiment, a plurality of connection elements of the first connection element 103 may include a first_first connection element 103_1. The first_first connection element 103_1 may be a connection element closest to the first interposer hole 300h_1 and the first substrate hole 101h_1 among the plurality of connection elements in the first connection element 103.

Referring again to FIGS. 5 and 6A, the width W1 of the first portion of the first semiconductor chip may be larger than the width W2 of the second portion of the first semiconductor chip. The second portion 110_2 of the first semiconductor chip may be inserted into the first interposer hole 300h_1 through the first substrate hole 101h_1. The second portion 110_2 of the first semiconductor chip may be between the first portion 110_1 of the first semiconductor chip and the second semiconductor chip 210. The second portion 110_2 of the first semiconductor chip may be exposed through the first substrate hole 101h_1 and the first interposer hole 300h_1 when viewed in a direction toward the first surface of the interposer 300 from the second surface of the interposer 300. When viewed from the first surface of the interposer 300 toward the second surface of the interposer 300, the second molding material 220 may be exposed as in FIG. 5.

The second portion 110_2 of the first semiconductor chip may not protrude from the second surface of the interposer 300. An empty space may be between the upper surface of the second portion 110_2 of the first semiconductor chip and the upper surface of the second molding material 220. Further, an empty space may be between the sidewall of the second portion 110_2 of the first semiconductor chip and the sidewall of the first substrate hole 101h_1, and between the sidewall of the second portion 110_2 of the first semiconductor chip and the sidewall of the first interposer hole 300h_1. For example, the area of the first interposer hole 300h_1 and the area of the first substrate hole 101h_1 may be larger than the area of the upper surface of the second portion 110_2 of the first semiconductor chip.

In one embodiment, as shown in FIG. 7, the heat transfer material layer 400 may be further formed between the upper surface of the second portion 110_2 of the first semiconductor chip and the upper surface of the second molding material 220. Further, the heat transfer material layer 400 may fill at least a part of the empty space formed between the sidewall of the first interposer hole 300h_1 and the sidewall of the second portion 110_2 of the first semiconductor chip, for example. The heat transfer material layer 400 may further include an optional insertion adhesive layer.

Figure 8A:
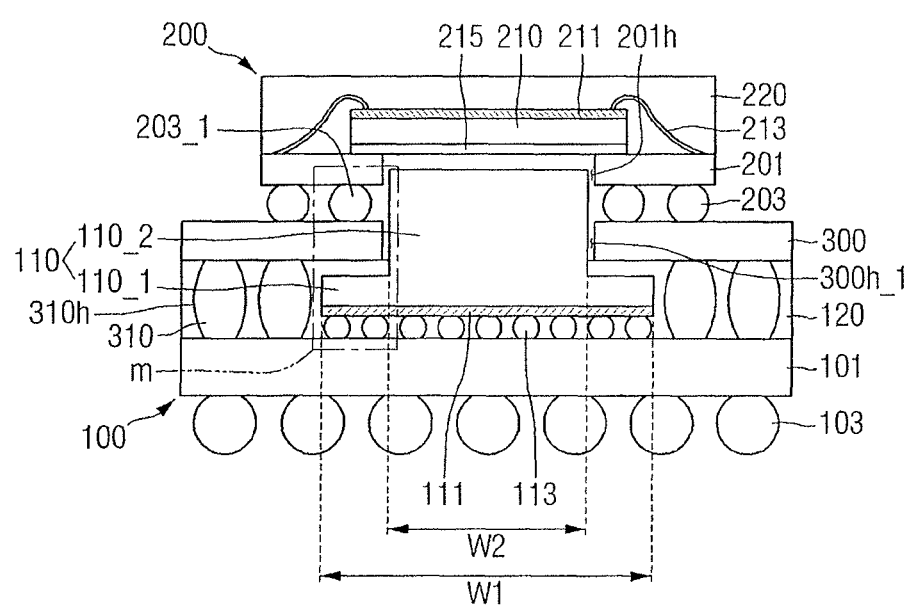
Figure 8B:
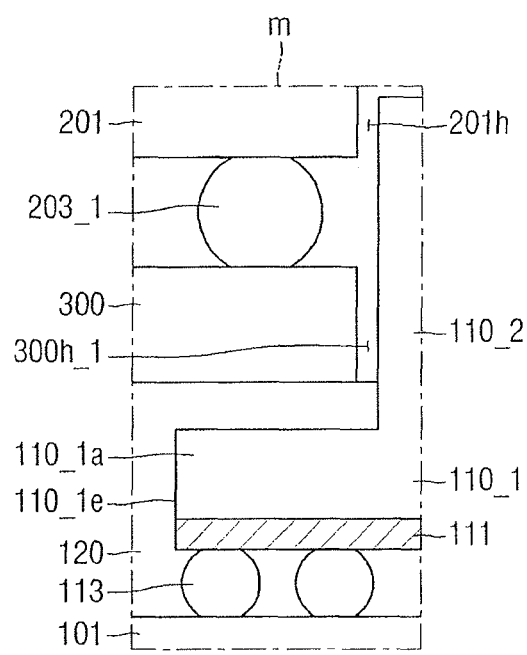
Figure 9:
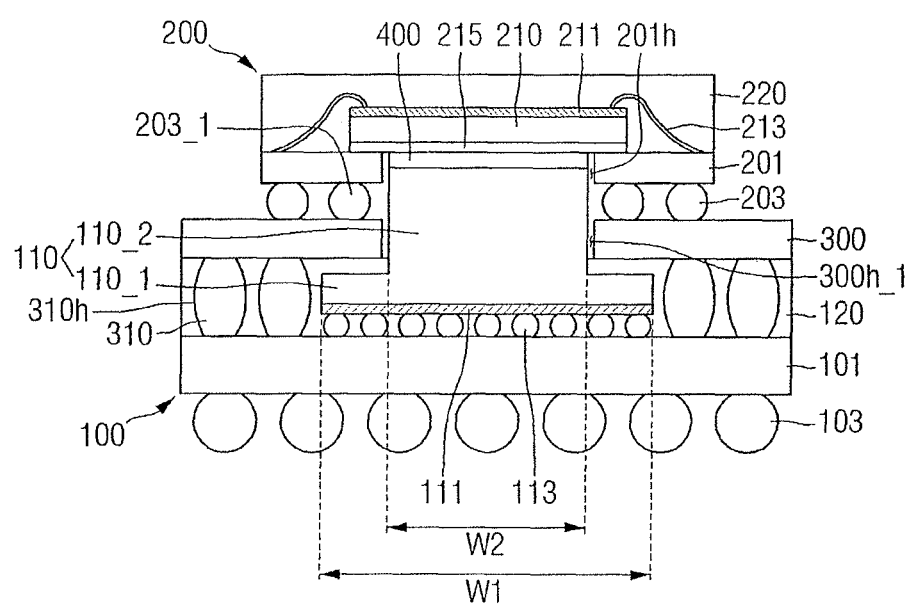

FIG. 8A illustrates a cross-sectional view taken along line A-A' in FIG. 1 according to an embodiment. FIG. 8B illustrates an enlarged view of region m in FIG. 8A according to an embodiment. FIG. 9 illustrates a cross-sectional view taken along line A-A' of FIG. 1 according to an embodiment.

Referring to FIGS. 1, 2A, and 8A, the second semiconductor package 200 may be on the first semiconductor package 100. The semiconductor device package of FIG. 2A and the semiconductor device package of FIG. 8A may be substantially the same except for a second substrate hole 201h and the second portion 110_2 of the first semiconductor chip. The second semiconductor package substrate 201 may include a first surface on which the second semiconductor chip 210 is disposed and a second surface on which the fourth connection element 203 is attached. The first and second surfaces may face each other.

The second semiconductor package substrate 201 may include the second substrate hole 201h passing through the second semiconductor package substrate 201. The second substrate hole 201h may extend from the first surface to the second surface of the second semiconductor package substrate 201. The second portion 110_2 of the first semiconductor chip may be inserted into the second substrate hole 201h through the first interposer hole 300h_1. For example, at least a part of the second portion 110_2 of the first semiconductor chip may be inserted into the second semiconductor package substrate 201.

In one embodiment, the second portion 110_2 of the first semiconductor chip may include a portion to be inserted into the first interposer hole 300h_1 and a portion to be inserted into the second substrate hole 201h. The upper surface of the second portion 110_2 of the first semiconductor chip may be in the portion to be inserted into the second substrate hole 201h. The upper surface of the second portion 110_2 of the first semiconductor chip may be below the first surface of the second semiconductor package substrate 201. In some embodiments, the width W1 of the first portion 110_1 of the first semiconductor chip may be substantially the same as the width W2 of the second portion 110_2 of the first semiconductor chip. In this case, the portion to be inserted into the first interposer hole 300h_1 and the second substrate hole 201h may be the second portion 110_2 of the first semiconductor chip. The remaining portion may be the first portion 110_1 of the first semiconductor chip.

An empty space may be between the upper surface of the second portion 110_2 of the first semiconductor chip and the first adhesive 215. Also, an empty space may be between the sidewall of the second portion 110_2 of the first semiconductor chip and the sidewall of the second substrate hole 201h, between the sidewall of the second portion 110_2 of the first semiconductor chip and the sidewall of the first interposer hole 300h_1, and between the sidewall of the second portion 110_2 of the first semiconductor chip and the fourth connection element 203. In one embodiment, the pad and the fourth' connection element (e.g., see FIG. 4A) for thermally connecting the first semiconductor package 100 to the second semiconductor package 200 may be further disposed between the upper surface of the second portion 110_2 of the first semiconductor chip and the first adhesive 215.

Further, as shown in FIG. 9, the heat transfer material layer 400 may be between the upper surface of the second portion 110_2 of the first semiconductor chip and the first adhesive 215. The heat transfer material layer 400 may fill, for example, at least a part of the empty space between the sidewall of the second portion 110_2 of the first semiconductor chip and the sidewall of the second substrate hole 201h. The heat transfer material layer 400 may further include an optional insertion adhesive layer.

Referring again to FIGS. 1, 2A, 8A, and 8B, the portion 110_1a of the first portion of the first semiconductor chip may at least partially overlap the fourth_first connection element 203_1. The overlapping direction may be, for example, a vertical direction with respect to the first semiconductor package substrate 101.

Figure 10:
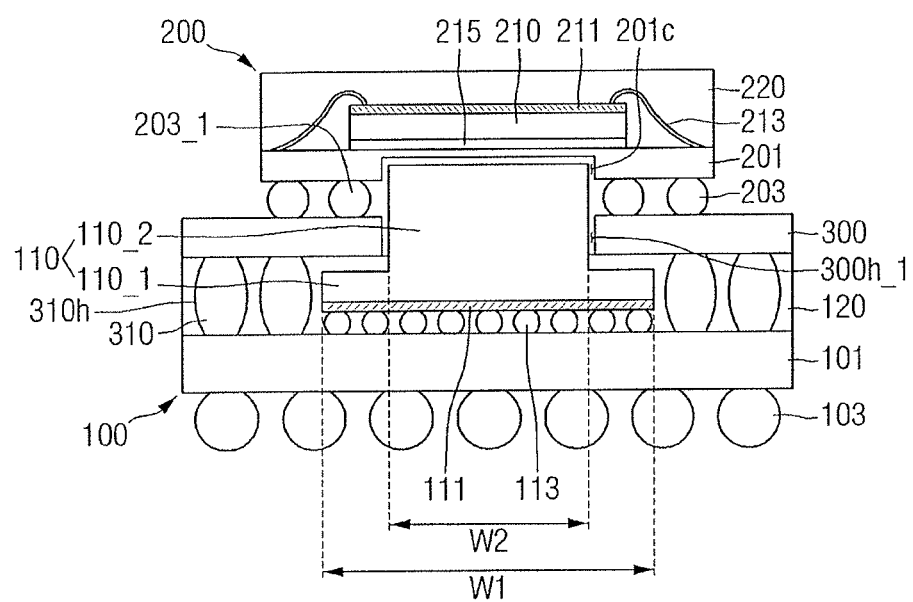

FIG. 10 illustrates a cross-sectional view taken along line A-A' in FIG. 1 according to another embodiment. Referring to FIGS. 1, 8A, 8B, and 10, the second semiconductor package 200 may be on the first semiconductor package 100. The semiconductor device package of FIG. 8A and the semiconductor device package of FIG. 10 may be substantially the same, except for a cavity 201c. For example, as compared with the second semiconductor package substrate 201 of FIG. 8A, the second semiconductor package substrate 201 of FIG. 10 may include the cavity 201c instead of the second substrate hole 201h. The cavity 201c may not pass through the second semiconductor package substrate 201.

The cavity 201c may be formed by removing a part of the second surface of the second semiconductor package substrate 201.

The second portion 110_2 of the first semiconductor chip may be inserted into the cavity 201c through the first interposer hole 300h_1. The second portion 110_2 of the first semiconductor chip may include a portion to be inserted into the first interposer hole 300h_1 and a portion to be inserted into the cavity 201c. The upper surface of the second portion 110_2 of the first semiconductor chip may be in the portion to be inserted into the cavity 201c. In some embodiments, the width W1 of the first portion 110_1 of the first semiconductor chip may be substantially the same as the width W2 of the second portion 110_2 of the first semiconductor chip. In this case, the portion to be inserted into the first interposer hole 300h_1 and the cavity 201c may be the second portion 110_2 of the first semiconductor chip. The remaining portion of the first semiconductor chip may be the first portion 110_1 of the first semiconductor chip.

An empty space may be between the upper surface of the second portion 110_2 of the first semiconductor chip and the cavity 201c. In one embodiment, one of the heat transfer material layer (e.g., see FIG. 4B) and the fourth connection element (e.g., see FIG. 4A) may be in an empty space between the upper surface of the second portion 110_2 of the first semiconductor chip and the cavity 201c. As a result, the first semiconductor package 100 may be thermally connected to the second semiconductor package 200. When the fourth connection element is in the empty space between the upper surface of the second portion 110_2 of the first semiconductor chip and the cavity 201c, a pad (e.g., a wetting layer) may be between the fourth connection element and the upper surface of the second portion 110_2 of the first semiconductor chip.

In the semiconductor device package according to some embodiments, heat dissipation generated from the first semiconductor chip 110 and the like may be effective as described above. In addition, by forming the second substrate hole 201h or the cavity 201c in the second semiconductor package substrate 201 of the second semiconductor package 200 on the first semiconductor package 100, the chances of warpage may be reduced.

Figure 11A:
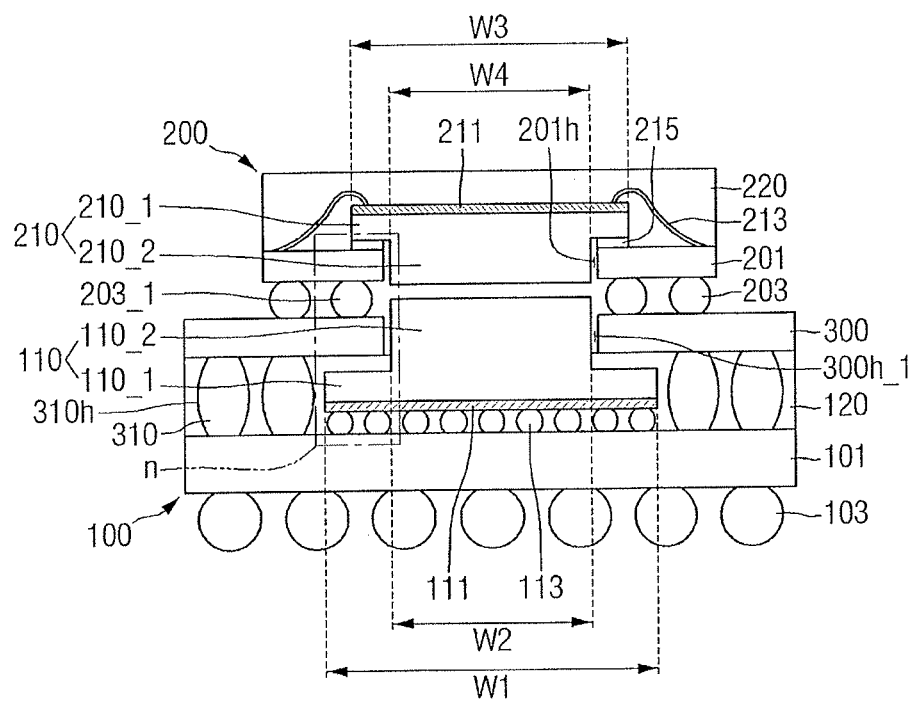
Figure 11B:
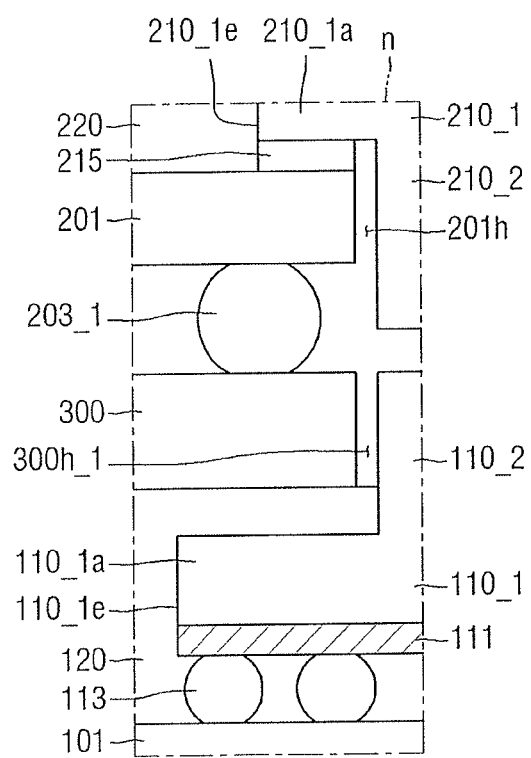
Figure 12:
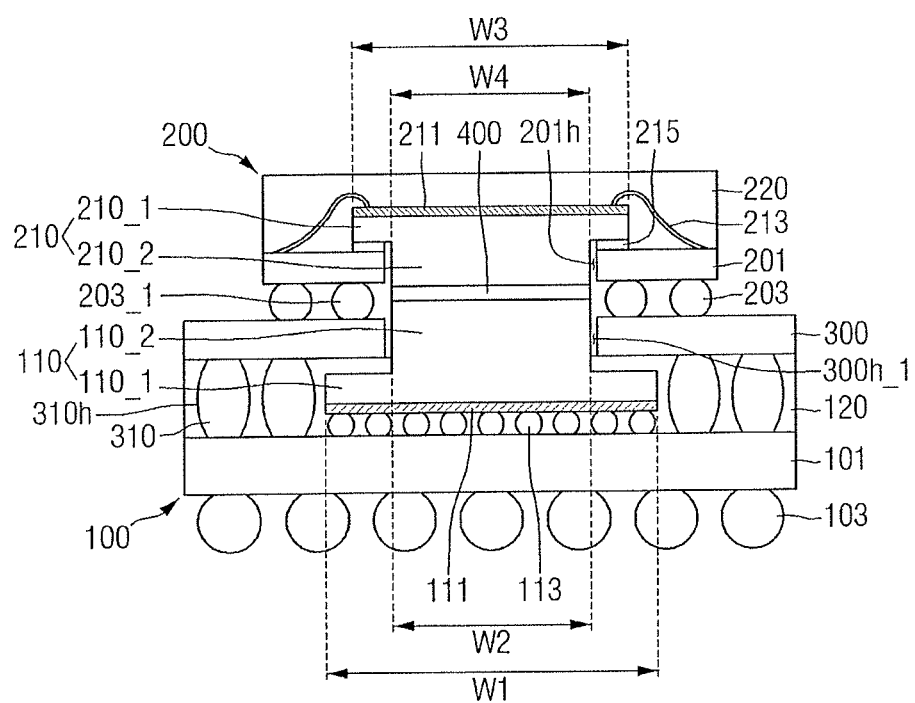

FIG. 11A illustrates a cross-sectional view taken along line A-A' in FIG. 1 according to an embodiment. FIG. 11B illustrates an enlarged view of region n in FIG. 11A according to an embodiment. FIG. 12 illustrates cross-sectional view taken along line A-A' of FIG. 1 according to an embodiment.

Referring to FIGS. 1 and 11A, the second semiconductor package 200 may be on the first semiconductor package 100. The first semiconductor package 100 of FIG. 11A may be substantially the same as the first semiconductor package 100 of FIG. 2A. In some embodiments, the width W1 of the first portion 110_1 of the first semiconductor chip may be substantially the same as the width W2 of the second portion 110_2 of the first semiconductor chip. In this case, the portion to be inserted into the first interposer hole 300h_1 may be the second portion 110_2 of the first semiconductor chip. The remaining portion of the first semiconductor chip may be the first portion 110_1 of the first semiconductor chip.

The second semiconductor package 200 may include the second semiconductor package substrate 201, the second semiconductor chip 210, the fifth connection element 213, the first adhesive 215, and the second molding material 220. The second semiconductor package substrate 201 including the second substrate hole 201h of FIG. 11A may be substantially the same as the second semiconductor package substrate 201 of FIG. 8A.

The second semiconductor chip 210 may have, for example, a stepped shape. The second semiconductor chip 210 may include a third portion 210_1 and a fourth portion 210_2. The fourth portion 210_2 of the second semiconductor chip may protrude from the third portion 210_1 of the second semiconductor chip. The third portion 210_1 of the second semiconductor chip may include, for example, the second semiconductor device circuit region 211. The third portion 210_1 and the fourth portion 210_2 of the second semiconductor chip may be connected to each other.

Each of the third portion 210_1 and the fourth portion 210_2 of the second semiconductor chip are illustrated to be a part of one second semiconductor chip 210. In one embodiment, the third portion 210_1 and the fourth portion 210_2 of the second semiconductor chip may be different semiconductor chips, respectively. In one embodiment, the second semiconductor chip 210 may be replaced, for example, by two different semiconductor chips. The width W3 of the third portion 210_1 of the second semiconductor chip may be different from (e.g., larger than) the width W4 of the fourth portion 210_2 of the second semiconductor chip.

The second semiconductor chip 210 may be electrically connected to the second semiconductor package substrate 201 through the fifth connection element 213. The fifth connecting element 213 may be, for example, wire bonding. The second semiconductor chip 210 may be electrically connected to the second semiconductor package substrate 201, for example, through the first adhesive 215. The first adhesive 215 may be between the third portion 210_1 of the second semiconductor chip and the second semiconductor package substrate 201.

The fourth portion 210_2 of the second semiconductor chip may be inserted into the second substrate hole 201h. The upper surface of the fourth portion 210_2 of the second semiconductor chip may face the upper surface of the second portion 110_2 of the first semiconductor chip inserted in the first interposer hole 300h_1. The second portion 110_2 of the first semiconductor chip may be disposed between the fourth portion 210_2 of the second semiconductor chip and the first portion 110_1 of the first semiconductor chip.

An empty space may be between the upper surface of the fourth portion 210_2 of the second semiconductor chip and the upper surface of the second portion 110_2 of the first semiconductor chip inserted in the first interposer hole 300h_1. Further, an empty space may be between the sidewall of the fourth portion 210_2 of the second semiconductor chip and the sidewall of the second substrate hole 201h.

As shown in FIG. 12, in one embodiment, the heat transfer material layer 400 may be between the upper surface of the fourth portion 210_2 of the second semiconductor chip and the upper surface of the second portion 110_2 of the first semiconductor chip inserted in the first interposer hole 300h_1. The heat transfer material layer 400 is illustrated to be only between the upper surface of the fourth portion 210_2 of the second semiconductor chip and the upper surface of the second portion 110_2 of the first semiconductor chip inserted in the first interposer hole 300h_1. In one embodiment, the heat transfer material layer 400 may fill at least a part of the empty space between the sidewall of the fourth portion 210_2 of the second semiconductor chip and the sidewall of the second substrate hole 201h.

Also, the heat transfer material layer 400 may, for example, fill at least a part of the empty space between the sidewall of the second portion 110_2 of the first semiconductor chip and the sidewall of the first interposer hole 300h_1. In some embodiments, the pad and the fourth connection element (e.g., see FIG. 4A) for thermally connecting the first semiconductor package 100 to the second semiconductor package 200 may be between the upper surface of the fourth portion 210_2 of the second semiconductor chip and the upper surface of the second portion 110_2 of the first semiconductor chip. The pad may be between the fourth connection element and the upper surface of the fourth portion 210_2 of the second semiconductor chip, and between the fourth connection element and the upper surface of the second portion 110_2 of the first semiconductor chip.

Referring again to FIGS. 1, 11A, and 11B, the portion 110_1a of the first portion of the first semiconductor chip and a portion 210_1a of the third portion of the second semiconductor chip may at least partially overlap a fourth_first connection element 203_1. The overlapping direction may be, for example, a vertical direction with respect to the first semiconductor package substrate 101. The portion 210_1a of the third portion of the second semiconductor chip may include an end portion 210_1e of the third portion 210_1 of the second semiconductor chip.

Figure 13:
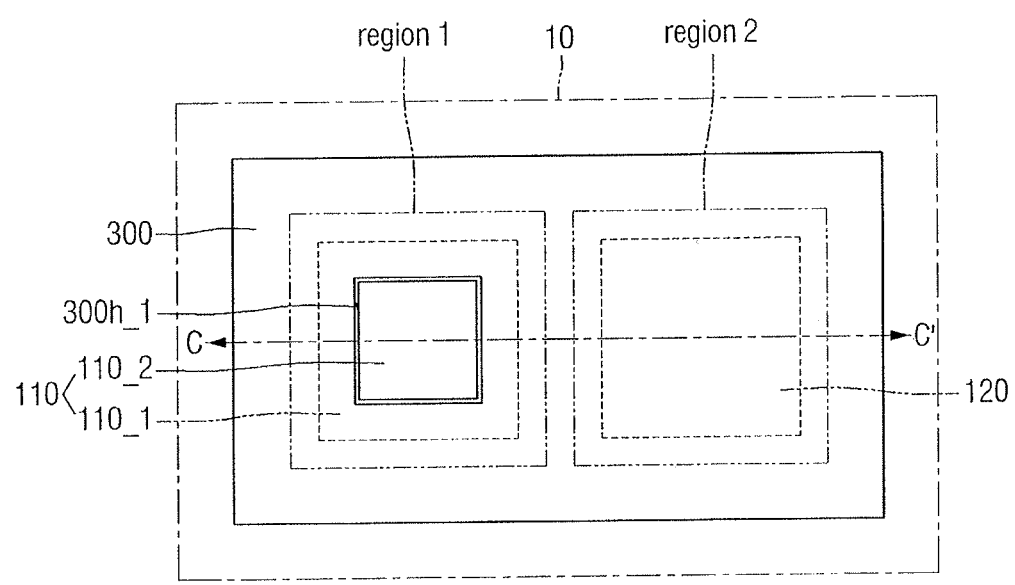
Figure 14:
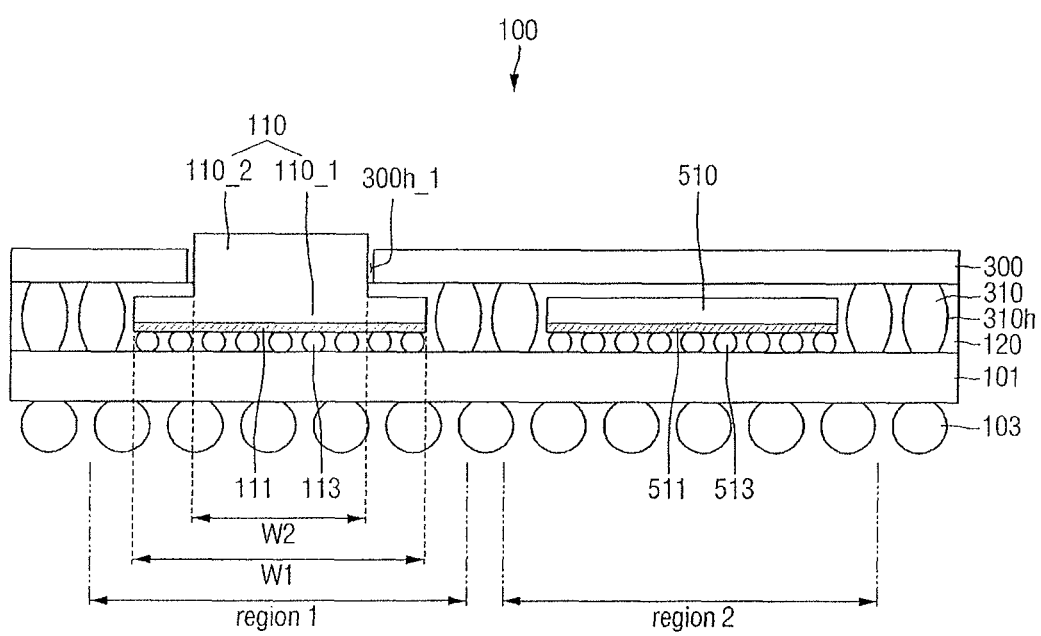

FIG. 13 illustrates another embodiment of a semiconductor device package. FIG. 14 illustrates a cross-sectional view taken along line C-C' in FIG. 13 according to one embodiment. FIG. 13 illustrates an embodiment of only a partial area of the substrate 10 on which a plurality of semiconductor packages may be mounted. In FIG. 13, only the substrate 10 and the interposer 300 are shown for clarity of illustration.

Referring to FIGS. 2A, 2C, 13, and 14, the interposer 300 may include a first region (region 1) and a second region (region 2). The interposer 300 may be on the first semiconductor package substrate 101. The first region and the second region of the interposer 300 may be regions spaced apart from each other. The first region may be a region where more heat is generated due to a semiconductor chip than the second region. The first region of the interposer 300 may include the first interposer hole 300h_1. The second region of the interposer 300 may not include a hole passing through the second region of the interposer 300.

The first region of the interposer 300 may include a second connection element 113, a first semiconductor chip 110, and a first interposer hole 300h_1. The second connection element 113 and the first semiconductor chip 110 may be substantially the same as the second connecting element 113 and the first semiconductor chip 110 in FIG. 2A. The second portion 110_2 of the first semiconductor chip may be inserted into the first interposer hole 300h_1. The first interposer hole 300h_1 may expose the second portion 110_2 of the first semiconductor chip. When another semiconductor package is on the interposer 300, one (e.g., the fourth connection element 203_1 in FIG. 2C) of the connection elements of the semiconductor package may overlap a portion (e.g., the portion 110_1a of the first portion of the first semiconductor chip of FIG. 2C) of the first portion 110_1 of the first semiconductor chip.

In some embodiments, the width W1 of the first portion 110_1 of the first semiconductor chip may be substantially the same as the width W2 of the second portion 110_2 of the first semiconductor chip. In this case, the portion to be inserted into the first interposer hole 300$h$_1 may be the second portion 110_2 of the first semiconductor chip. The remaining portion of the first semiconductor chip may be the first portion 110_1 of the first semiconductor chip.

The second region of the interposer 300 may include a third semiconductor chip 510 and a sixth connection element 513. The third semiconductor chip 510 may be on the first semiconductor package substrate 101 and spaced apart from the first semiconductor chip 110. The third semiconductor chip 510 may be a flip chip. The lower surface of the third semiconductor chip 510 may be a third semiconductor device circuit region 511. The sixth connection element 513 may be in the third semiconductor device circuit region 511. The sixth connection element 513 may be, for example, a solder ball or a conductive bump.

The third semiconductor chip 510 may be electrically connected to the first semiconductor package substrate 101 through the sixth connection element 513. A predetermined number of the sixth connection elements 513 are illustrated. In another embodiment, a different number of the sixth connection elements 513 may be provided.

A part of the third semiconductor chip 510 may not be inserted into the interposer 300. The interposer 300 may not expose the third semiconductor chip 510. The third semiconductor chip 510 may be between the interposer 300 and the first semiconductor package substrate 101 and surrounded by the first molding material 120. A predetermined number of the third connection elements 310 are illustrated. In one another embodiment, a different number of the third connection elements 310 may be provided. In various embodiments, different types of other semiconductor packages may be on the first semiconductor package 100.

In the semiconductor device package according to some embodiments, an interposer hole (e.g., the first interposer hole 300$h$_1) may be selectively formed in a portion of the interposer 300 that generates more heat than the surrounding areas to promote heat transfer in the vertical and horizontal directions.

Figure 15:
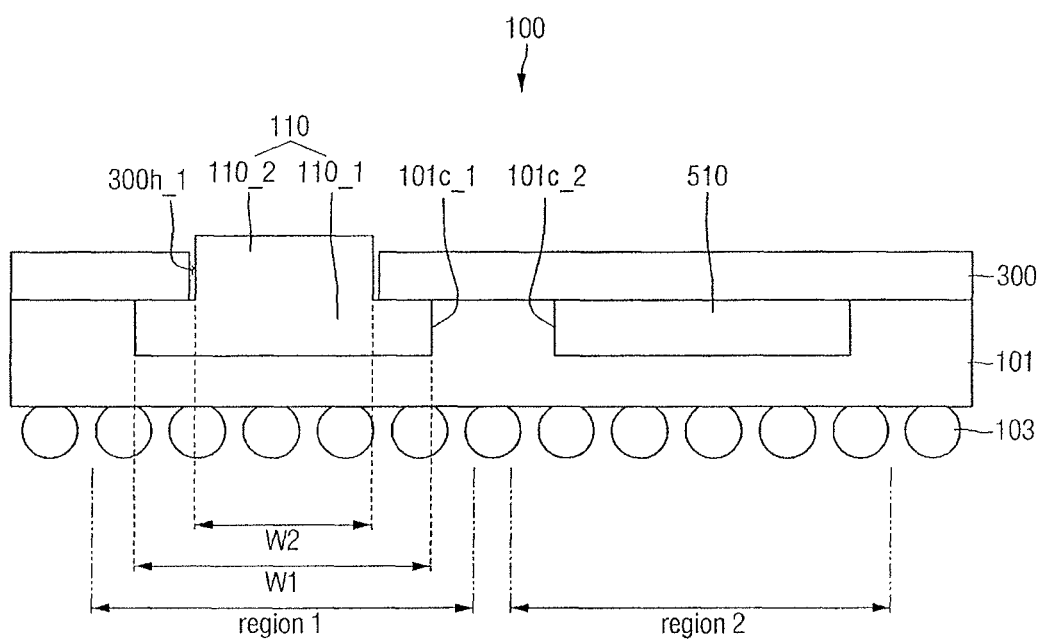

FIG. 15 illustrates a cross-sectional view taken along line C-C' in FIG. 13. Referring to FIGS. 2A, 13, 14, and 15, the first semiconductor package substrate 101 may include a first substrate cavity 101$c$_1 and a second substrate cavity 101$c$_2 which are spaced apart from each other. The first substrate cavity 101$c$_1 and the second substrate cavity 101$c$_2 may be formed by removing a part of the first semiconductor package substrate 101. The first substrate cavity 101$c$_1 may be in the first region (region 1) of the interposer 300. The second substrate cavity 101$c$_2 may be in the second region (region 2) of the interposer 300. The first semiconductor chip 110 may be substantially the same as the first semiconductor chip 110 in FIGS. 2A and 14. In one embodiment, the first portion 110_1 of the first semiconductor chip may be in the first substrate cavity 101$c$_1 and the second portion 110_2 of the first semiconductor chip may be inserted into the first interposer hole 300$h$_1. The third semiconductor chip 510 may be substantially the same as the third semiconductor chip 510 in FIG. 14. In one embodiment, the third semiconductor chip 510 may be in the second substrate cavity 101$c$_2.

In some embodiments, the width W1 of the first portion 110_1 of the first semiconductor chip may be substantially the same as the width W2 of the second portion 110_2 of the first semiconductor chip. In this case, the portion to be inserted into the first interposer hole 300$h$_1 may be the second portion 110_2 of the first semiconductor chip, and the portion in the first substrate cavity 101$c$_1 may be the first portion 110_1 of the first semiconductor chip. In one embodiment, various types of other semiconductor packages may be disposed on the first semiconductor package 100.

Figure 16:
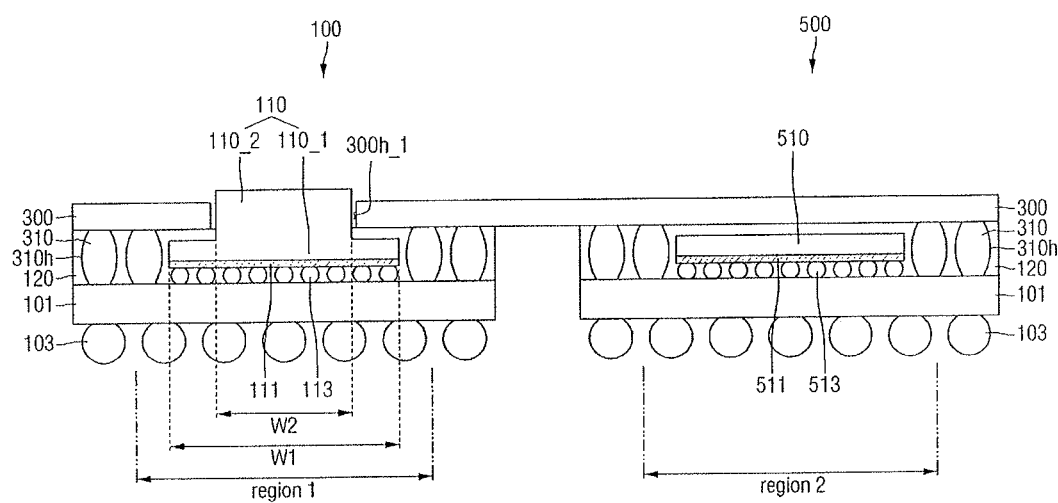

FIG. 16 illustrates a cross-sectional view taken along line C-C' in FIG. 13 according to one embodiment. In FIG. 16, the substrate 10 is not shown for clarity of illustration. Also, in FIG. 16, the first semiconductor package 100 and other semiconductor packages that may be disposed on a third semiconductor package 500 are not shown for clarity of illustration.

Referring to FIGS. 2A, 6A, 13, and 16, the first semiconductor package 100 may be in the first region (region 1) of the interposer 300, and the third semiconductor package 500 may be in the second region (region 2) of the interposer 300. The first semiconductor package 100 may be substantially the same as the first semiconductor package 100 of FIG. 2A. The third semiconductor package 500 may be substantially the same as the second semiconductor package 200 of FIG. 6A.

In some embodiments, the width W1 of the first portion 110_1 of the first semiconductor chip may be substantially the same as the width W2 of the second portion 110_2 of the first semiconductor chip. In this case, the portion to be inserted into the first interposer hole 300$h$_1 may be the second portion 110_2 of the first semiconductor chip. The remaining portion of the first semiconductor chip may be the first portion 110_1 of the first semiconductor chip.

The first semiconductor package 100 and the third semiconductor package 500 may share the interposer 300. In other embodiments, various types of other semiconductor packages may be on the first semiconductor package 100 and the third semiconductor package 500.

Figure 17:
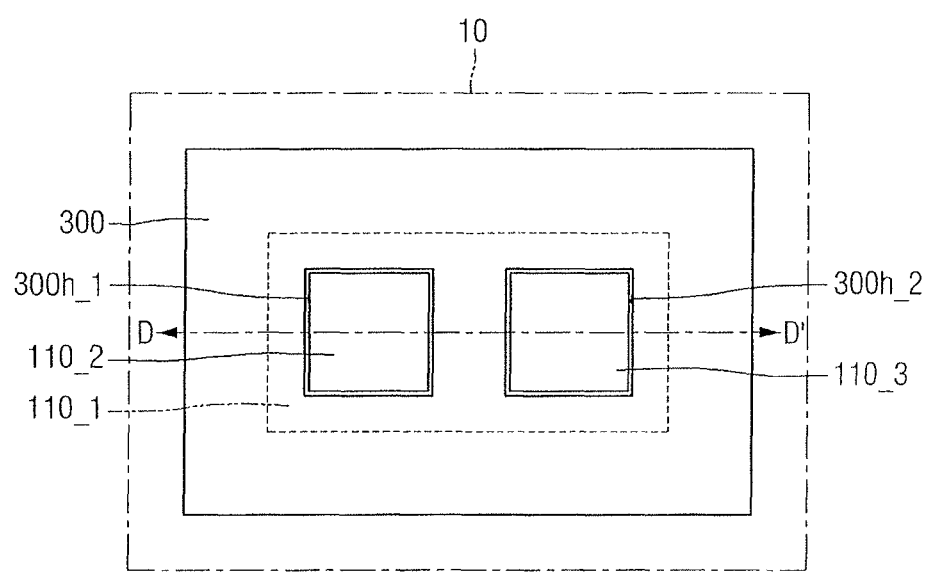
Figure 18:
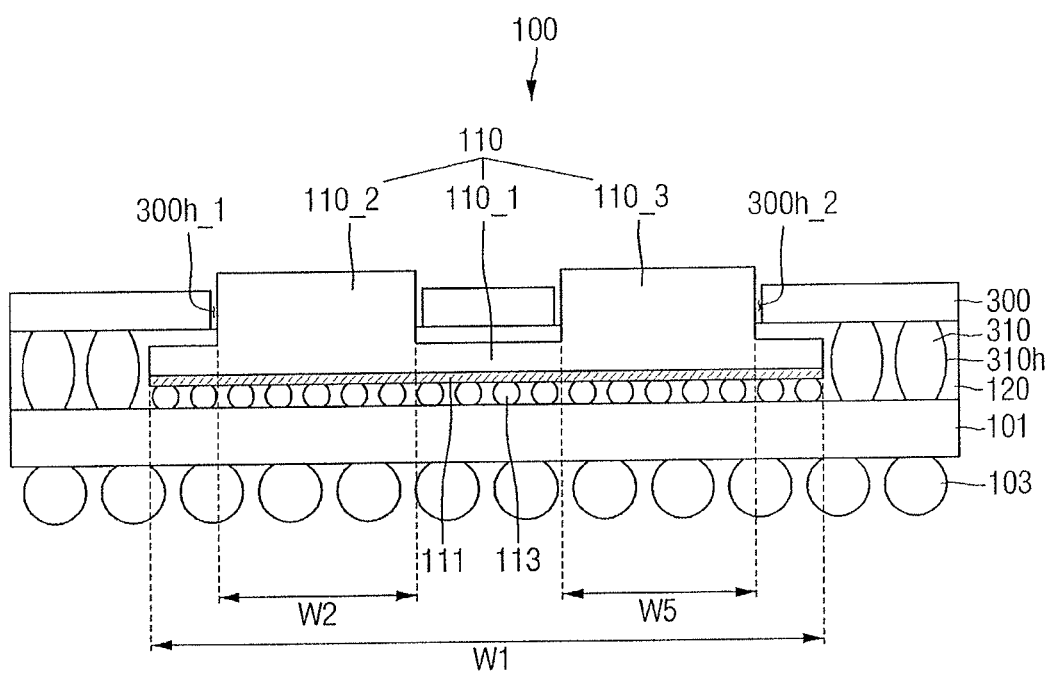
Figure 19:
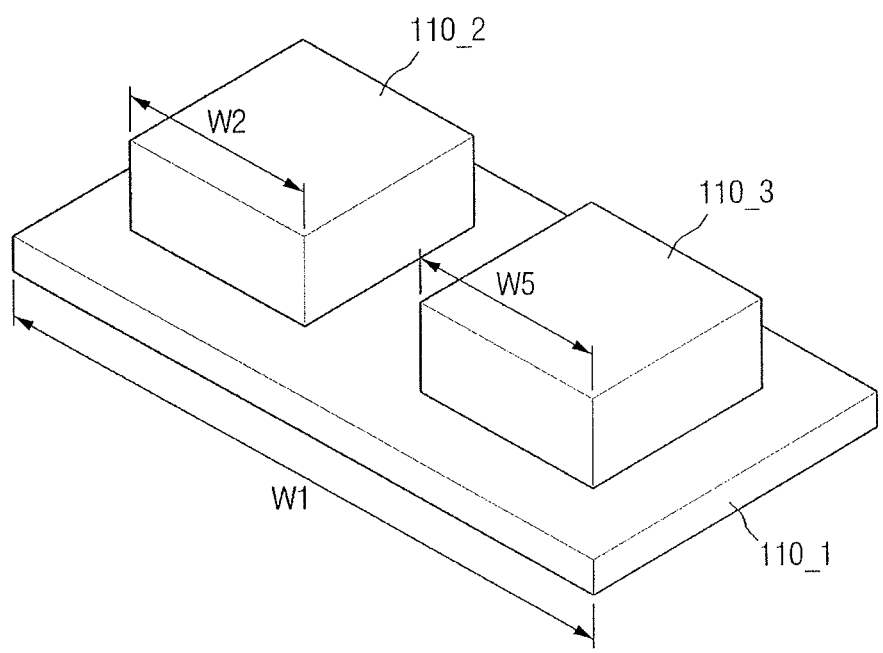

FIG. 17 illustrates another embodiment of a semiconductor device package. FIG. 18 illustrates a cross-sectional view taken along line D-D' in FIG. 17 according to one embodiment. FIG. 19 is a perspective view of a first semiconductor chip 110 of FIG. 17, which is a perspective view of a semiconductor chip in a semiconductor device package according to some embodiments.

FIG. 17 illustrates only a partial area of the substrate 10 on which a plurality of semiconductor packages may be mounted according to one embodiment. In FIG. 17, only the substrate 10 and the interposer 300 are shown for clarity of illustration. In FIG. 18, the substrate 10 and other semiconductor packages that may be on the first semiconductor package 100 are not shown for clarity of illustration.

Referring to FIGS. 17, 18, and 19, the first semiconductor chip 110 may further include a fifth portion 110_3 which is spaced apart from the second portion 110_2, and protrudes from the first portion 110_1. The first portion 110_1 of the first semiconductor chip may include the first semiconductor device circuit region 111. The width W5 of the fifth portion 110_3 of the first semiconductor chip may be less than the width W1 of the first portion 110_1 of the first semiconductor chip.

The interposer 300 may further include a second interposer hole 300$h$_2 spaced apart from the first interposer hole 300$h$_1. The second interposer hole 300$h$_2 may pass through the interposer 300. The fifth portion 110_3 of the first semiconductor chip may be inserted into the second interposer hole 300$h$_2. For example, the second interposer hole 300$h$_2 may expose the fifth portion 110_3 of the first semiconductor chip. In one embodiment, various types of other semiconductor packages may be on the first semiconductor package 100.

Figure 20:
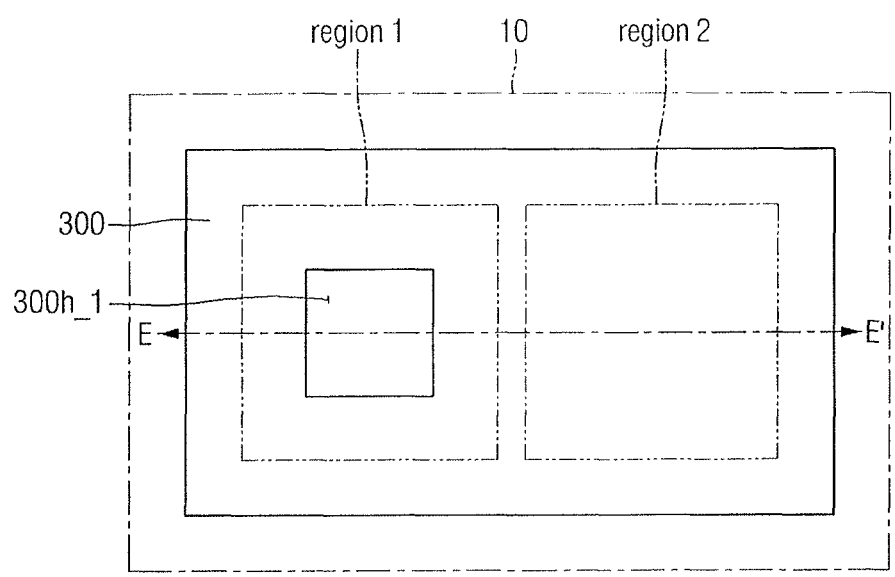
Figure 21:
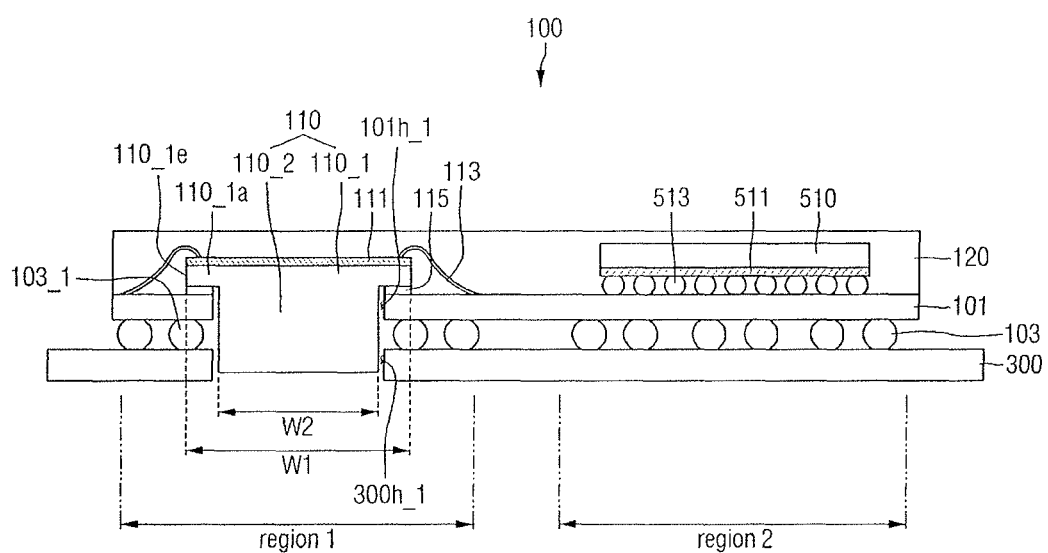

FIG. 20 illustrates another embodiment of a semiconductor device package. FIG. 21 is a cross-sectional view taken along line E-E' in FIG. 20 according to one embodiment. FIG. 20 illustrates only a partial area of the substrate 10 on which a plurality of semiconductor packages may be mounted according to one embodiment. In FIG. 20, only the substrate 10 and the interposer 300 are shown for clarity of illustration. In FIG. 21, the substrate 10 and other semiconductor packages that may be under the first semiconductor package 100 are not shown for clarity of illustration.

Referring to FIGS. 6A, 14, 20 and 21, the first semiconductor package substrate 101 may be on the interposer 300. The first region (region 1) of the interposer 300 may include the first semiconductor package substrate 101 including the second connection element 113, the first semiconductor chip 110 and the first substrate hole 101h_1, and the first interposer hole 300h_1. The first semiconductor package substrate 101 including the second connection element 113, the first semiconductor chip 110 and the first substrate hole 101h_1 may be substantially the same as that in FIG. 6A.

The second region (region 2) of the interposer 300 may include the third semiconductor chip 510 and the sixth connection element 513. The third semiconductor chip 510 and the sixth connection element 513 may be substantially the same as those in FIG. 14. Various types of other semiconductor packages may be under the first semiconductor package 100 in at least one embodiment.

Figure 22:
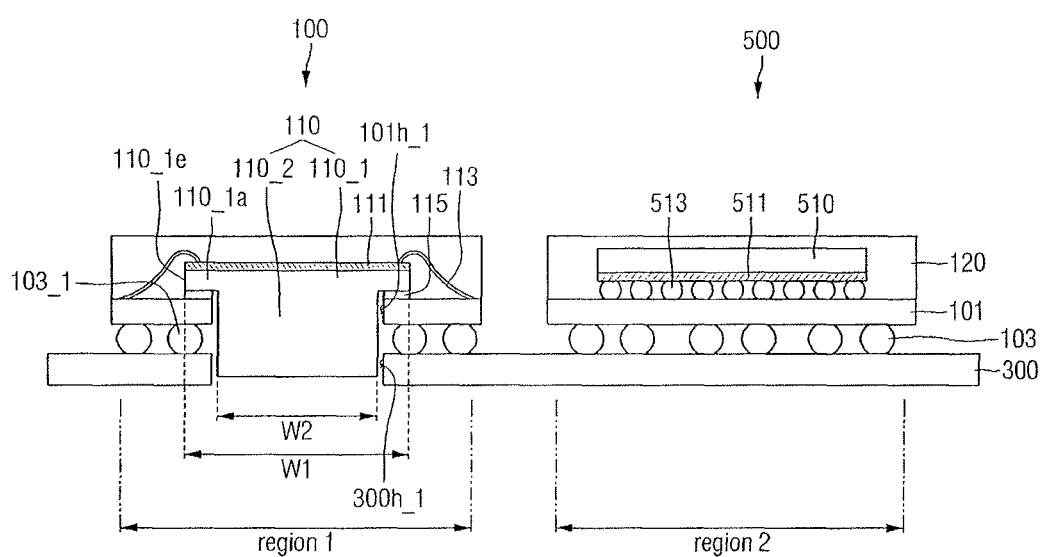

FIG. 22 illustrates a cross-sectional view taken along line E-E' in FIG. 20 according to one embodiment. In FIG. 22, the substrate 10 is not shown for clarity of illustration. Also, in FIG. 22, other semiconductor packages that may be under the interposer 300 are not shown for clarity of illustration.

Referring to FIGS. 6A, 20, and 22, the first semiconductor package 100 may in the first region (region 1) of the interposer 300 and the third semiconductor package 500 may be in the second region (region 2) of the interposer 300. The first semiconductor package 100 and the third semiconductor package 500 may share the interposer 300.

The first semiconductor package 100 may be substantially the same as the first semiconductor package 100 of FIG. 6A. The third semiconductor package 500 may be substantially the same as the second semiconductor package 200 of FIG. 6A. Unlike the first molding material 120 of FIG. 6A, the first molding material 120 of FIG. 22 may not include the hole 310h for receiving the third connection element 310. Various types of other semiconductor packages may be under the first semiconductor package 100 and the third semiconductor package 500 according to one embodiment.

Figure 23:
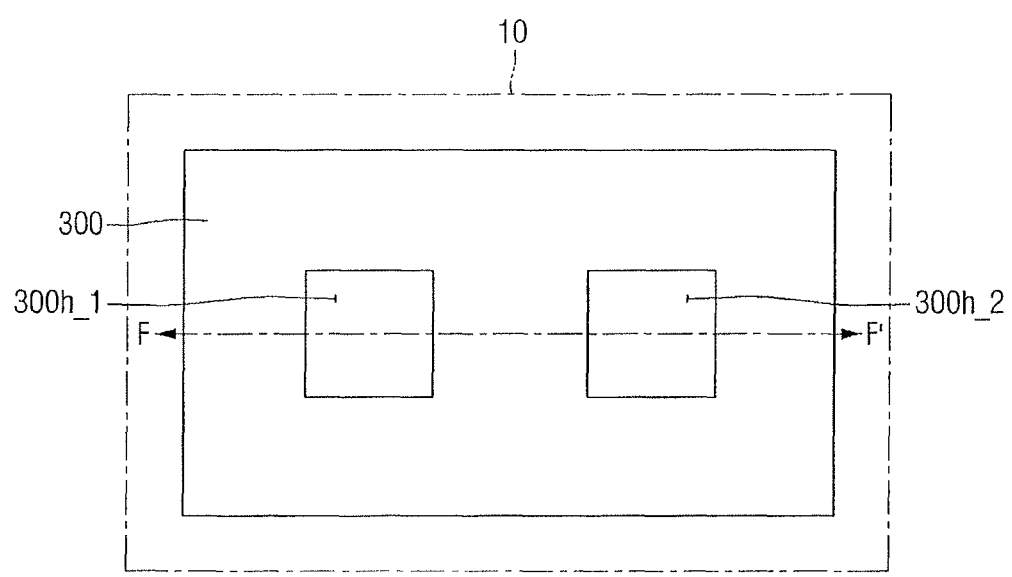
Figure 24:
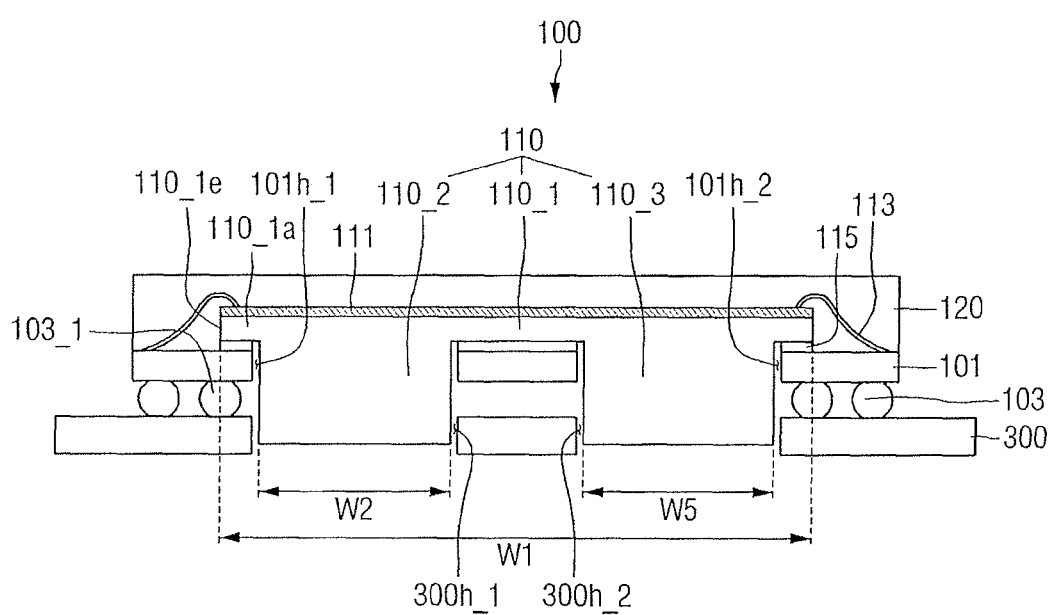

FIG. 23 illustrates another embodiment of a semiconductor device package. FIG. 24 illustrates a cross-sectional view taken along line F-F' in FIG. 23 according to one embodiment. FIG. 23 is a view showing only a partial area of the substrate 10 on which a plurality of semiconductor packages can be mounted. In FIG. 23, only the substrate 10 and the interposer 300 are shown for clarity of illustration. In FIG. 24, other semiconductor packages that may be disposed under the interposer 300 are not shown for clarity of illustration.

Referring to FIGS. 23 and 24, the first semiconductor chip 110 may further include the fifth portion 110_3 which is spaced apart from the second portion 110_2 and protrudes from the first portion 110_1. The first portion 110_1 of the first semiconductor chip may include the first semiconductor device circuit region 111. The width W5 of the fifth portion 110_3 of the first semiconductor chip may be less than the width W1 of the first portion 110_1 of the first semiconductor chip.

The interposer 300 may further include the second interposer hole 300h_2 spaced apart from the first interposer hole 300h_1. The second interposer hole 300h_2 may pass through the interposer 300. The fifth portion 110_3 of the first semiconductor chip may be inserted into the second interposer hole 300h_2. For example, the second interposer hole 300h_2 may expose the fifth portion 110_3 of the first semiconductor chip. Various types of other semiconductor packages may be under the first semiconductor package 100 according to an embodiment.

FIGS. 25A to 25D illustrate stages of an embodiment of a method for fabricating a semiconductor device package. FIGS. 25A to 25D illustrate a method for forming the first semiconductor chip 110 (e.g., the first semiconductor chip 110 of FIG. 3) and the second semiconductor chip 210 (e.g., the second semiconductor chip 210 of FIG. 11A) according to some embodiments.

Figure 25A:
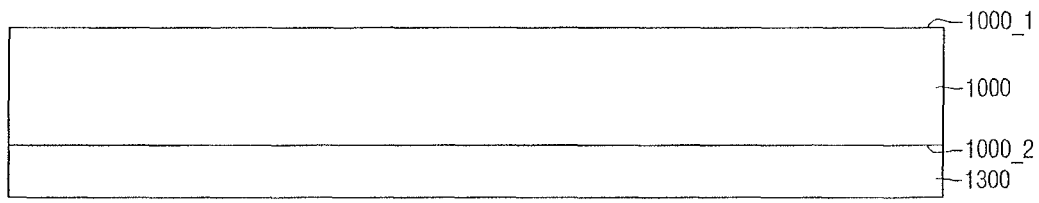
FIGS. 25A to 25D, 26A, 26B, 27A to 27C, 28A to 28D, 29A and 29B illustrate stages in embodiments of a method for fabricating a semiconductor device package.

Referring to FIG. 25A, a wafer 1000 may include a first surface 1000_1 and a second surface 1000_2 facing each other. A first tape 1300 may be attached on the second surface 1000_2 of the wafer.

Figure 25B:
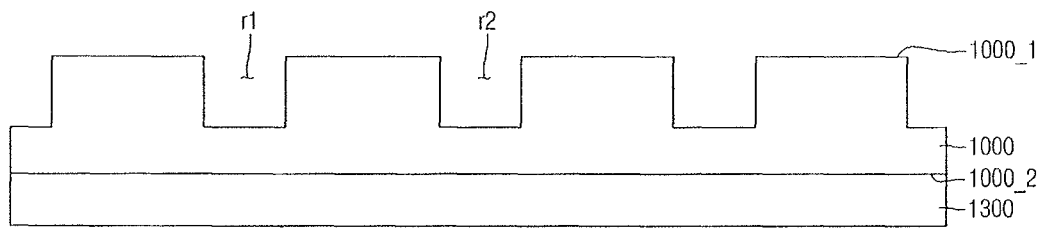

Referring to FIG. 25B, a part of the first surface 1000_1 of the wafer may be removed to form a plurality of recesses which are spaced apart from each other. The plurality of recesses may include a first recess r1 and a second recess r2. The first recess r1 and the second recess r2 are illustrated to have a rectangular shape, but may have a different shape in another embodiment. For example, depending on the shape of a blade used in a process, the first recess r1 and the second recess r2 may have a round shape. Depending on the shape of the blade used in the process, the sidewall of each of the first and second recesses r1 and r2 may have, for example, a slope. The first recess r1 and the second recess r2 are illustrated to be empty spaces. In one embodiment, a sacrificial layer may be filled in the first recess r1 and the second recess r2 in order to ensure the reliability of the process.

Figure 25C:
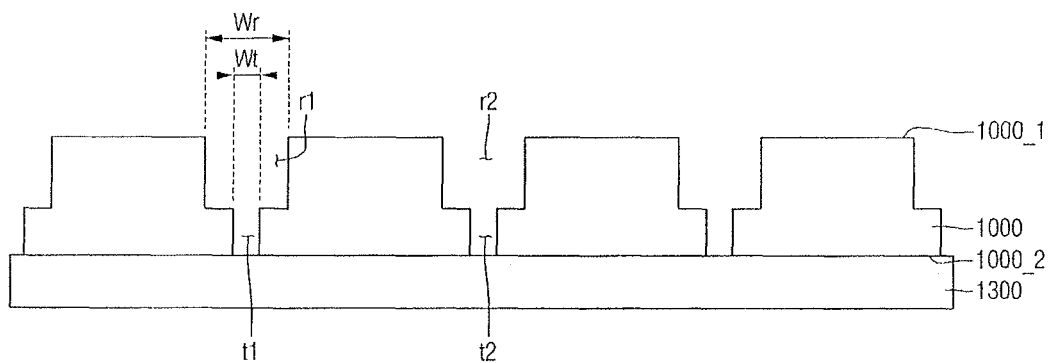

Referring to FIG. 25C, a plurality of trenches passing through the wafer 1000 may be on the bottom surfaces of the plurality of recesses, respectively. The plurality of trenches may include a first trench t1 and a second trench t2. The first trench t1 may be formed on the bottom surface of the first recess r1. The second trench t2 may be formed on the bottom surface of the second recess r2.

When the sacrificial layer is filled in the first recess r1 and the second recess r2, the first trench t1 and the second trench t2 may be formed to pass through the sacrificial layer in the first recess r1 and the second recess r2, respectively. The width of each of the plurality of recesses may be larger than the width of each of the plurality of trenches. For example, a width Wr of the first recess r1 may be larger than a width Wt of the first trench t1.

Figure 25D:
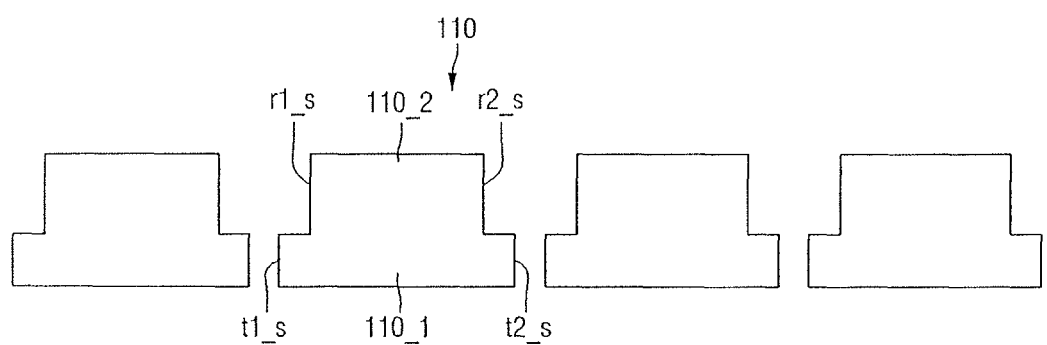

Referring to FIGS. 3, 11A, and 25D, the first tape 1300 may be removed from the second surface 1000_2 of the wafer, thereby fabricating a plurality of semiconductor chips. The shape of each of the plurality of semiconductor chips may be a stepped shape. The plurality of semiconductor chips may include the first semiconductor chip 110 (for example, as shown in FIG. 3) and the second semiconductor chip 210 (for example, as shown in FIG. 11A), which have the same shape. For example, the first portion 110_1 of the first semiconductor chip may include a sidewall t1_s of the first trench t1 and a sidewall t2_s of the second trench t2. The second portion 110_2 of the first semiconductor chip may include a sidewall r1_s of the first recess r1 and a sidewall r2_s of the second recess r2. The first semiconductor chip 110 including the first to fifth portions 110_1, 110_2 and 110_3 of FIG. 19 may be fabricated by further forming a third recess between the first recess r1 and the second recess r2 in FIG. 25B. Then, in FIG. 25C, a trench may not be formed on the bottom surface of the third recess.

Figure 26A:
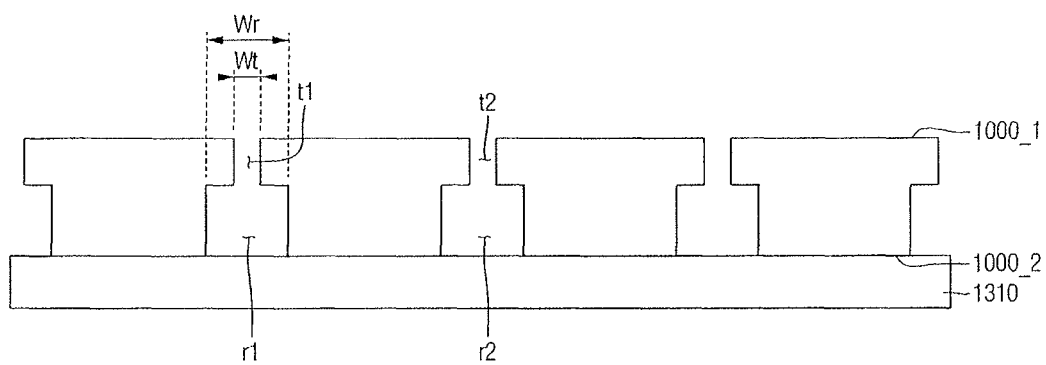
Figure 26B:
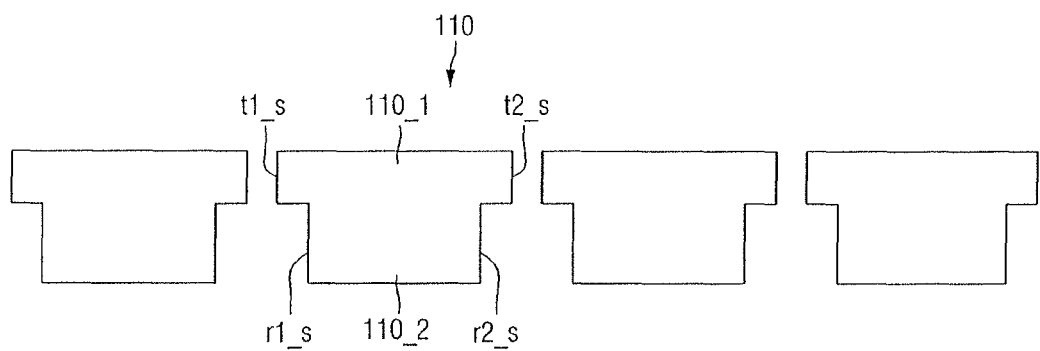

FIGS. 26A and 26B illustrate an embodiment of a method for forming the first semiconductor chip 110 (for example, as shown in FIG. 3) and the second semiconductor chip 210 (for example, as shown in FIG. 11A). FIG. 26A is a view after the steps of FIGS. 25A and 25B are performed.

Referring to FIG. 26A, after the steps of FIGS. 25A and 25B are performed on the wafer 1000, the first tape 1300 may be removed from the second surface 1000_2 of the wafer. A second tape 1310 may be attached to the first surface 1000_1 of the wafer. After the second tape 1310 is attached, a plurality of trenches including the first trench t1 and the second trench t2 may be formed. Referring to FIG. 26B, the second tape 1310 may be removed from the first surface 1000_1 of the wafer, thereby fabricating a plurality of semiconductor chips.

Figure 27A:
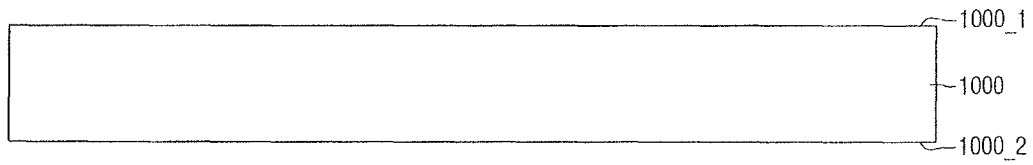
Figure 27B:
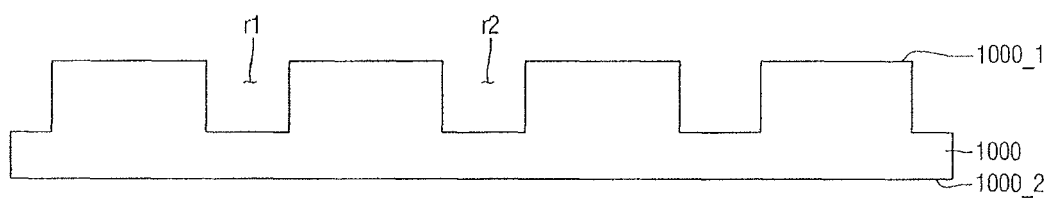
Figure 27C:
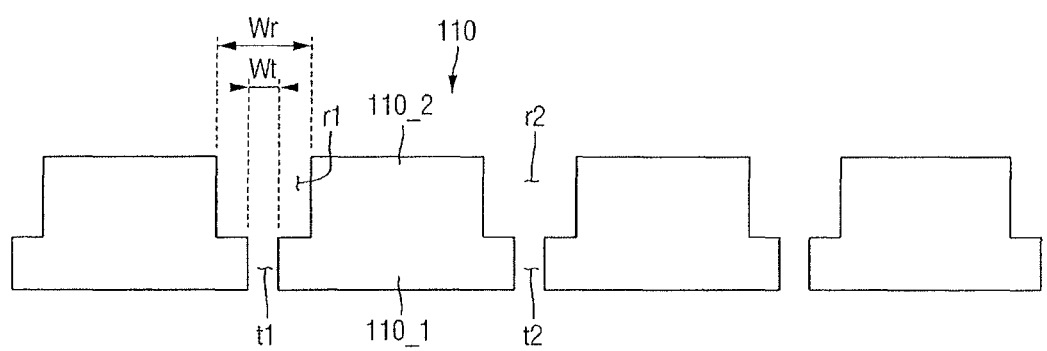

FIGS. 27A to 27C illustrate an embodiment of a method for forming the first semiconductor chip 110 (for example, as shown in FIG. 3) and the second semiconductor chip 210 (for example, as shown in FIG. 11A). Referring to FIG. 27A, the wafer 1000 having a rear surface on which grinding has been performed may include the first surface 1000_1 and the second surface 1000_2 facing each other.

Referring to FIG. 27B, a part of the first surface 1000_1 of the wafer may be removed to form a plurality of recesses spaced apart from each other. For example, it is possible to change the crystal of the wafer 1000 by locally irradiating a laser beam on the first surface 1000_1 of the wafer. For example, in the case of a silicon wafer, a portion irradiated with the laser beam may be changed to polysilicon. A portion of the first surface 1000_1 of the wafer on which the laser beam is locally irradiated may be removed through an etching process to faun a plurality of recesses. In one embodiment, boron may be locally implanted into the first surface 1000_1 of the wafer. A portion of the first surface 1000_1 of the wafer into which boron is implanted may be removed through a selective etching process to form a plurality of recesses. In one embodiment, for example, a plurality of recesses may be formed by rotating the blade in the horizontal or vertical direction with respect to the first surface 1000_1 of the wafer.

Referring to FIG. 27C, a plurality of trenches passing through the wafer 1000 may be formed on the bottom surfaces of the plurality of recesses. respectively. For example, a plurality of trenches may be formed through an etching process using the above-described laser or boron implantation. In one embodiment, a plurality of trenches may be formed using, for example, a laser or a sawing blade.

FIGS. 28A to 28D illustrate an embodiment of a method for fabricating a semiconductor device package including the first semiconductor chip 110 formed using the process of FIGS. 25A to 25D, the process of FIGS. 26A to 26B, or the process of FIGS. 27A to 27C.

Figure 28A:
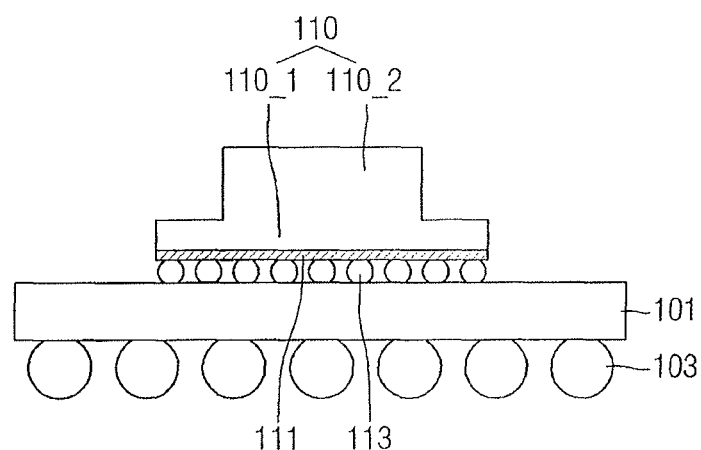

Referring to FIG. 28A, the method for fabricating a semiconductor device package according to some embodiments may include mounting the first semiconductor chip 110 on the first semiconductor package substrate 101.

Figure 28B:
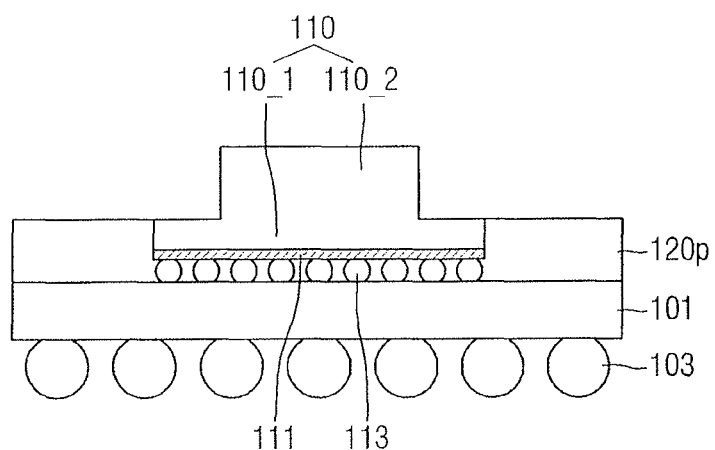

Referring to FIG. 28B, the method for fabricating a semiconductor device package according to some embodiments may include forming a pre-molding material 120p on the first semiconductor package substrate 101 so as to surround the sidewall of the first semiconductor chip 110. The pre-molding material 120p may be formed by, for example, a Molded Underfill (MUF) method.

Figure 28C:
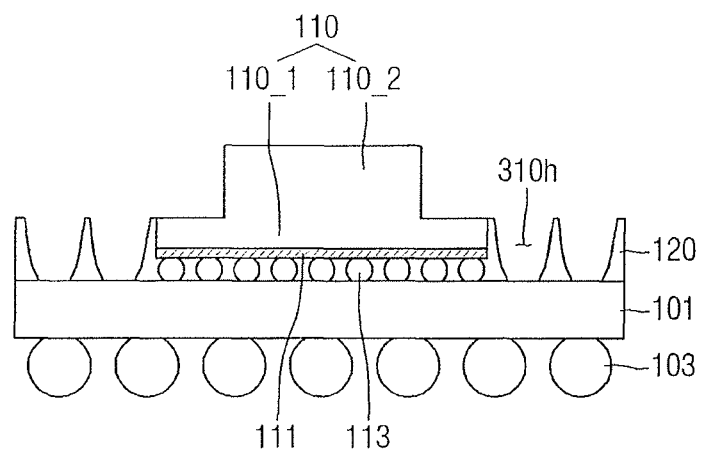

Referring to FIG. 28C, the method for fabricating a semiconductor device package according to some embodiments may include forming the hole 310h in the pre-molding material 120p to form the first molding material 120. The hole 310h may be formed by removing a part of the pre-molding material 120p.

Figure 28D:
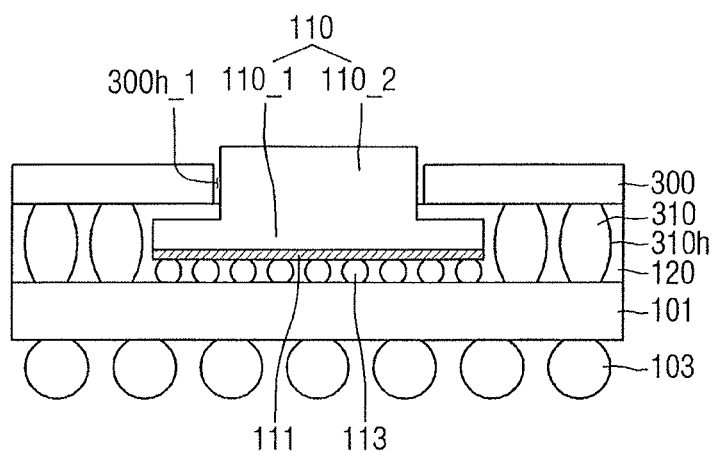

Referring to FIG. 28D, the method for fabricating a semiconductor device package according to some embodiments may include disposing the second portion 1102 of the first semiconductor chip so as to overlap the first interposer hole 300h_1. For example, the interposer 300 may be disposed such that the second portion 110_2 of the first semiconductor chip is inserted into the first interposer hole 300h_1. Further, the interposer 300 may be disposed such that the third connection element 310 is inserted into the hole 310h. After the interposer 300 is disposed, the first molding material 120 may be further formed to fill the empty space between the interposer 300 and the first semiconductor package substrate 101.

Referring to FIG. 2A, the method for fabricating a semiconductor device package according to some embodiments may include disposing another semiconductor package (e.g., the second semiconductor package 200) on the interposer 300.

Figure 29A:
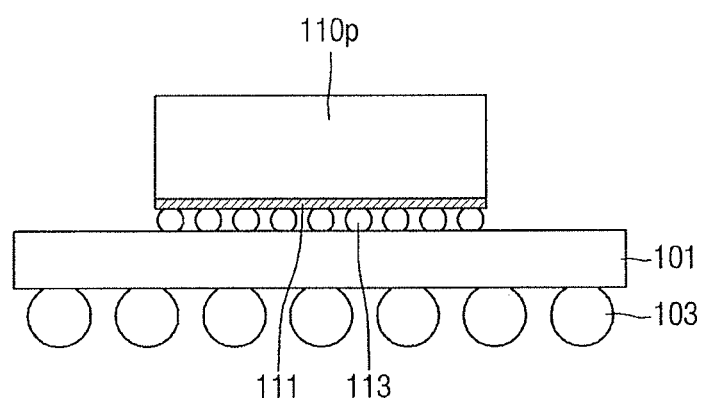

Referring to FIG. 29A, the method for fabricating a semiconductor device package according to some embodiments may include mounting a pre-semiconductor chip 110p having no steps on the first semiconductor package substrate 101.

Figure 29B:
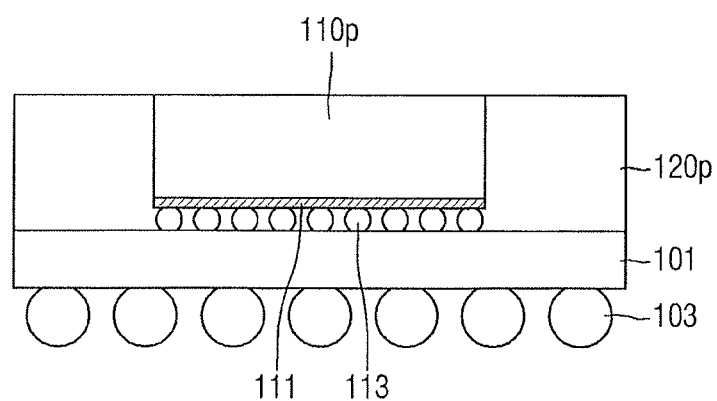

Referring to FIG. 29B, the method for fabricating a semiconductor device package according to some embodiments may include forming the pre-molding material 120p on the first semiconductor package substrate 101 so as to surround the side surface of the pre-semiconductor chip 110p. The pre-molding material 120p may be formed to fill the space between the pre-semiconductor chip 110p and the first semiconductor package substrate 101. The pre-molding material 120p may expose the upper surface of the pre-semiconductor chip 110p.

Referring to FIG. 28B, the method for fabricating a semiconductor device package according to some embodiments may include forming the first semiconductor chip 110 by removing a part of the pre-molding material 120p and a part of the pre-semiconductor chip 110p. For example, the method for fabricating a semiconductor device package according to some embodiments may include removing a part of the pre-molding material 120p to reduce the height of the pre-molding material 120p. In this case, a part of the sidewall of the pre-semiconductor chip 110p adjacent to the pre-molding material 120p may also be removed. The portion where the sidewall of the pre-semiconductor chip 110p adjacent to the pre-molding material 120p is removed may be the second portion 110_2 of the first semiconductor chip. The portion surrounded by the pre-molding material 120p whose height is reduced may be the first portion 110_1 of the first semiconductor chip.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A semiconductor device package, comprising:
   a first semiconductor package including a first semiconductor package substrate and a first semiconductor chip;
   a second semiconductor package including a second semiconductor package substrate and a second semiconductor chip, the second semiconductor package being on the first semiconductor package;
   an interposer between the first semiconductor package and the second semiconductor package to electrically connect the first semiconductor package to the second semiconductor package; and
   a first molding material on the first semiconductor package substrate and along side surfaces of the first semiconductor chip,
   wherein the interposer includes a first interposer hole passing through the interposer,
   wherein the first semiconductor chip has a stepped shape including a first portion and a second portion which protrudes from the first portion, the second portion of the stepped shape of the first semiconductor chip being inserted into the first interposer hole, and
   wherein an upper surface of the second portion is located higher than an upper surface of the interposer, the second portion of the stepped shape of the first semiconductor chip protruding above the first molding material.

2. The semiconductor device package as claimed in claim 1, wherein:
   the interposer includes a connector on the interposer,
   a width of the first portion is larger than a width of the second portion, and
   a part of the first portion overlaps the connector.

3. The semiconductor device package as claimed in claim 1, wherein the first portion is between the second portion and the first semiconductor package substrate.

4. The semiconductor device package as claimed in claim 1, wherein:
   the second semiconductor package substrate includes a substrate hole passing through the second semiconductor package substrate,
   the second portion is inserted into the substrate hole through the first interposer hole, and
   the second portion is between the first portion and the second semiconductor chip.

5. The semiconductor device package as claimed in claim 1, wherein:
   the second semiconductor package substrate includes a substrate hole passing through the second semiconductor package substrate,
   the second portion of the first semiconductor chip includes a first part to be inserted into the first interposer hole and a second part to be inserted into the substrate hole, and
   the first part to be inserted into the first interposer hole and the second part to be inserted into the substrate hole are both between the first portion of the stepped shape of the first semiconductor chip and the second semiconductor chip.

6. The semiconductor device package as claimed in claim 1, wherein:
   the second semiconductor package substrate includes a substrate hole passing through the second semiconductor package substrate,
   the second semiconductor chip includes a third portion and a fourth portion which protrudes from the third portion and is inserted into the substrate hole,
   a width of the third portion is larger than a width of the fourth portion, and
   the second portion of the stepped shape of the first semiconductor chip is between the fourth portion of the second semiconductor chip and the first portion of the stepped shape of the first semiconductor chip.

7. The semiconductor device package as claimed in claim 1, wherein:
   the first semiconductor package includes a third semiconductor chip spaced apart from the first semiconductor chip, and
   the third semiconductor chip is not inserted into the interposer.

8. The semiconductor device package as claimed in claim 7, wherein:
   the first semiconductor package substrate includes a first cavity and a second cavity spaced apart from the first cavity,
   the first portion is in the first cavity, and
   the third semiconductor chip is in the second cavity.

9. The semiconductor device package as claimed in claim 1, further comprising:
   a third semiconductor package including a third semiconductor package substrate and a third semiconductor chip,
   the third semiconductor package shares the interposer with the first and second semiconductor packages, and
   the third semiconductor chip is not inserted into the interposer.

10. The semiconductor device package as claimed in claim 1, wherein:
    a width of the first portion of the stepped shape of the first semiconductor chip is larger than a width of the second portion of the stepped shape of the first semiconductor chip,
    the first semiconductor chip includes a third portion spaced apart from the second portion and protruding from the first portion,
    a width of the third portion of the first semiconductor chip is less than a width of the first portion of the stepped shape of the first semiconductor chip,
    the interposer includes a second interposer hole spaced apart from the first interposer hole and passes through the interposer, and
    the third portion of the first semiconductor chip is inserted into the second interposer hole.

11. The semiconductor device package as claimed in claim 1, wherein an entirety of the first molding material is between the interposer and the first semiconductor package substrate.

12. An apparatus, comprising:
    a first semiconductor package;
    a second semiconductor package on the first semiconductor package; and
    an interposer to electrically connect the first semiconductor package to the second semiconductor package, the interposer including an interposer hole,
    wherein the first semiconductor package includes a semiconductor chip with a stepped shape, the stepped shape having a first portion and a second portion, the first portion of the stepped shape extending into the interposer hole in a direction of the second semiconductor package, and a width of the second portion being larger than a width of the first portion, wherein the interposer includes a connector on the interposer, a part of the second portion overlapping the connector and the interposer, and wherein an upper surface of the first portion is higher than an upper surface of the interposer.

13. The apparatus as claimed in claim 12, wherein the second semiconductor package overlaps the first semiconductor package.

* * * * *